(12) United States Patent
Kim et al.

(10) Patent No.: US 10,431,314 B2
(45) Date of Patent: Oct. 1, 2019

(54) NON-VOLATILE MEMORY DEVICE FOR IMPROVING DATA RELIABILITY AND OPERATING METHOD THEREOF

(71) Applicant: SAMSUNG ELECTRONICS CO., LTD., Suwon-si, Gyeonggi-do (KR)

(72) Inventors: Seung-Bum Kim, Hwaseong-si (KR); Deok-Woo Lee, Suwon-si (KR); Dong-Hun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/996,485

(22) Filed: Jun. 3, 2018

(65) Prior Publication Data

US 2019/0172544 A1 Jun. 6, 2019

(30) Foreign Application Priority Data

Dec. 5, 2017 (KR) .................. 10-2017-0166196

(51) Int. Cl.
| | |
|---|---|
| *G11C 16/04* | (2006.01) |
| *G11C 16/34* | (2006.01) |
| *G11C 11/56* | (2006.01) |
| *G11C 16/30* | (2006.01) |
| *G11C 16/14* | (2006.01) |

(Continued)

(52) U.S. Cl.
CPC ...... *G11C 16/3445* (2013.01); *G11C 11/5671* (2013.01); *G11C 16/10* (2013.01); *G11C 16/14* (2013.01); *G11C 16/30* (2013.01); *G11C 16/0483* (2013.01); *H01L 27/1157* (2013.01); *H01L 27/11582* (2013.01)

(58) Field of Classification Search
CPC . G11C 16/3445; G11C 11/5671; G11C 16/10; G11C 16/14; G11C 16/30; G11C 16/0483; H01L 27/1157; H01L 27/11582
See application file for complete search history.

(56) References Cited

U.S. PATENT DOCUMENTS

| | | |
|---|---|---|
| 4,474,560 A | 10/1984 | Weaver |
| 7,308,525 B2 | 12/2007 | Lasser et al. |

(Continued)

FOREIGN PATENT DOCUMENTS

| | | |
|---|---|---|
| KR | 10-1044015 | 6/2011 |

*Primary Examiner* — Pho M Luu
(74) *Attorney, Agent, or Firm* — Volentine, Whitt & Francos, PLLC

(57) ABSTRACT

A non-volatile memory device includes multiple word lines, and a voltage generator. Some of the word lines correspond to a deterioration area. The voltage generator is configured to generate a program voltage provided to multiple memory cells through the word lines. Control logic implemented by the non-volatile memory device is configured to control a program operation and an erase operation on the word lines. The deterioration area includes word lines of a first group and word lines of a second group. The control logic is configured to control a program sequence so that each of the word lines of the second group is programmed after an adjacent word line of the first group is programmed, and to control a distribution so that a threshold voltage level corresponding to an erase state of each of the word lines of the first group is higher than a threshold voltage level corresponding to an erase state of each of the word lines of the second group.

20 Claims, 32 Drawing Sheets

(51) Int. Cl.
    *G11C 16/10*         (2006.01)
    *H01L 27/11582*   (2017.01)
    *H01L 27/1157*    (2017.01)

(56) References Cited

U.S. PATENT DOCUMENTS

| | | |
|---|---|---|
| 7,474,560 B2 | 1/2009 | Aritome |
| 7,508,732 B2 | 3/2009 | Park et al. |
| 7,802,132 B2 | 9/2010 | Annavajjhala et al. |
| 7,949,821 B2 | 5/2011 | Han |
| 8,072,804 B2 | 12/2011 | Lee et al. |
| 8,144,505 B2 | 3/2012 | Lee |
| 8,230,165 B2 | 7/2012 | Han |
| 8,331,144 B2 * | 12/2012 | Yoo .................... G11C 11/5628 |
| | | 365/185.02 |
| 8,339,847 B2 | 12/2012 | Lim et al. |
| 8,595,423 B2 | 11/2013 | Han |
| 9,245,630 B2 * | 1/2016 | Kwak .................... G11C 16/10 |
| 9,646,978 B2 | 5/2017 | Wu et al. |
| 10,147,495 B2 * | 12/2018 | Park .................... G11C 11/5628 |
| 10,157,674 B2 * | 12/2018 | Kim ...................... G11C 16/14 |

\* cited by examiner

FIG. 6

|      | SSL[1] | SSL[2] | SSL[3] | SSL[4] |
|------|--------|--------|--------|--------|
| DUM2 | MLC    | MLC    | MLC    | MLC    |
| WL63 | QLC    | QLC    | QLC    | QLC    |
| WL62 | QLC    | QLC    | QLC    | QLC    |
| WL61 | QLC    | QLC    | QLC    | QLC    |
| ⋮    | ⋮      | ⋮      | ⋮      | ⋮      |
| WL5  | QLC    | QLC    | QLC    | QLC    |
| WL4  | TLC    | TLC    | TLC    | TLC    |
| WL3  | QLC    | QLC    | QLC    | QLC    |
| WL2  | TLC    | TLC    | TLC    | TLC    |
| WL1  | QLC    | QLC    | QLC    | QLC    |
| WL0  | TLC    | TLC    | TLC    | TLC    |
| DUM1 | SLC    | SLC    | SLC    | SLC    |

FIG. 9A

| WL | DATA | Order |
|---|---|---|
| ⋮ | ⋮ | ⋮ |
| WL6 | TLC | 4 |
| WL5 | QLC | 7 |
| WL4 | TLC | 3 |
| WL3 | QLC | 6 |
| WL2 | TLC | 2 |
| WL1 | QLC | 5 |
| WL0 | TLC | 1 |

FIG. 9B

| WL | DATA | Order |
|---|---|---|
| ⋮ | ⋮ | ⋮ |
| WL6 | TLC | 6 |
| WL5 | QLC | 7 |
| WL4 | TLC | 4 |
| WL3 | QLC | 5 |
| WL2 | TLC | 2 |
| WL1 | QLC | 3 |
| WL0 | TLC | 1 |

FIG. 14B

| WL | DATA | Order |
|---|---|---|
| ⋮ | ⋮ | ⋮ |
| WL6 | TLC | 1 |
| WL5 | QLC | 5 |
| WL4 | TLC | 2 |
| WL3 | QLC | 6 |
| WL2 | TLC | 3 |
| WL1 | QLC | 7 |
| WL0 | TLC | 4 |

Program ↓

FIG. 15A

|       | SSL[1] | SSL[2] | SSL[3] | SSL[4] |
|-------|--------|--------|--------|--------|
| DUM2  | MLC    | MLC    | MLC    | MLC    |
| WL63  | QLC    | QLC    | QLC    | QLC    |
| WL62  | QLC    | QLC    | QLC    | QLC    |
| WL61  | QLC    | QLC    | QLC    | QLC    |
| ⋮     | ⋮      | ⋮      | ⋮      | ⋮      |
| WL6   | TLC    | TLC    | TLC    | TLC    |
| WL5   | QLC    | QLC    | QLC    | QLC    |
| WL4   | TLC    | TLC    | TLC    | TLC    |
| WL3   | TLC    | TLC    | TLC    | TLC    |
| WL2   | QLC    | QLC    | QLC    | QLC    |
| WL1   | TLC    | TLC    | TLC    | TLC    |
| WL0   | TLC    | TLC    | TLC    | TLC    |
| DUM1  | SLC    | SLC    | SLC    | SLC    |

FIG. 15B

|  | SSL[1] | SSL[2] | SSL[3] | SSL[4] |
|---|---|---|---|---|
| DUM2 | MLC | MLC | MLC | MLC |
| WL63 | QLC | QLC | QLC | QLC |
| WL62 | QLC | QLC | QLC | QLC |
| WL61 | QLC | QLC | QLC | QLC |
| ⋮ | ⋮ | ⋮ | ⋮ | ⋮ |
| WL6 | QLC | QLC | QLC | QLC |
| WL5 | TLC | TLC | TLC | TLC |
| WL4 | QLC | QLC | QLC | QLC |
| WL3 | TLC | TLC | TLC | TLC |
| WL2 | TLC | TLC | TLC | TLC |
| WL1 | TLC | TLC | TLC | TLC |
| WL0 | TLC | TLC | TLC | TLC |
| DUM1 | SLC | SLC | SLC | SLC |

FIG. 16A

|      | SSL[1] | SSL[2] | SSL[3] | SSL[4] |
|------|--------|--------|--------|--------|
| DUM2 | MLC    | MLC    | MLC    | MLC    |
| WL63 | QLC    | QLC    | QLC    | QLC    |
| WL62 | QLC    | QLC    | QLC    | QLC    |
| WL61 | QLC    | QLC    | QLC    | QLC    |
| ⋮    | ⋮      | ⋮      | ⋮      | ⋮      |
| WL6  | MLC    | MLC    | MLC    | MLC    |
| WL5  | TLC    | TLC    | TLC    | TLC    |
| WL4  | MLC    | MLC    | MLC    | MLC    |
| WL3  | TLC    | TLC    | TLC    | TLC    |
| WL2  | MLC    | MLC    | MLC    | MLC    |
| WL1  | TLC    | TLC    | TLC    | TLC    |
| WL0  | MLC    | MLC    | MLC    | MLC    |
| DUM1 | SLC    | SLC    | SLC    | SLC    |

FIG. 16B

|      | SSL[1] | SSL[2] | SSL[3] | SSL[4] |
|------|--------|--------|--------|--------|
| DUM2 | MLC    | MLC    | MLC    | MLC    |
| WL63 | QLC    | QLC    | QLC    | QLC    |
| WL62 | QLC    | QLC    | QLC    | QLC    |
| WL61 | QLC    | QLC    | QLC    | QLC    |
| ⋮    | ⋮      | ⋮      | ⋮      | ⋮      |
| WL6  | TLC    | TLC    | TLC    | TLC    |
| WL5  | QLC    | QLC    | QLC    | QLC    |
| WL4  | TLC    | TLC    | TLC    | TLC    |
| WL3  | QLC    | QLC    | QLC    | QLC    |
| WL2  | MLC    | MLC    | MLC    | MLC    |
| WL1  | QLC    | QLC    | QLC    | QLC    |
| WL0  | SLC    | SLC    | SLC    | SLC    |
| DUM1 | SLC    | SLC    | SLC    | SLC    |

FIG. 16C

|      | SSL[1] | SSL[2] | SSL[3] | SSL[4] |
|------|--------|--------|--------|--------|
| DUM2 | MLC    | MLC    | MLC    | MLC    |
| WL63 | TLC    | TLC    | TLC    | TLC    |
| WL62 | TLC    | TLC    | TLC    | TLC    |
| WL61 | TLC    | TLC    | TLC    | TLC    |
| ⋮    | ⋮      | ⋮      | ⋮      | ⋮      |
| WL6  | MLC    | MLC    | MLC    | MLC    |
| WL5  | TLC    | TLC    | TLC    | TLC    |
| WL4  | MLC    | MLC    | MLC    | MLC    |
| WL3  | TLC    | TLC    | TLC    | TLC    |
| WL2  | MLC    | MLC    | MLC    | MLC    |
| WL1  | TLC    | TLC    | TLC    | TLC    |
| WL0  | MLC    | MLC    | MLC    | MLC    |
| DUM1 | SLC    | SLC    | SLC    | SLC    |

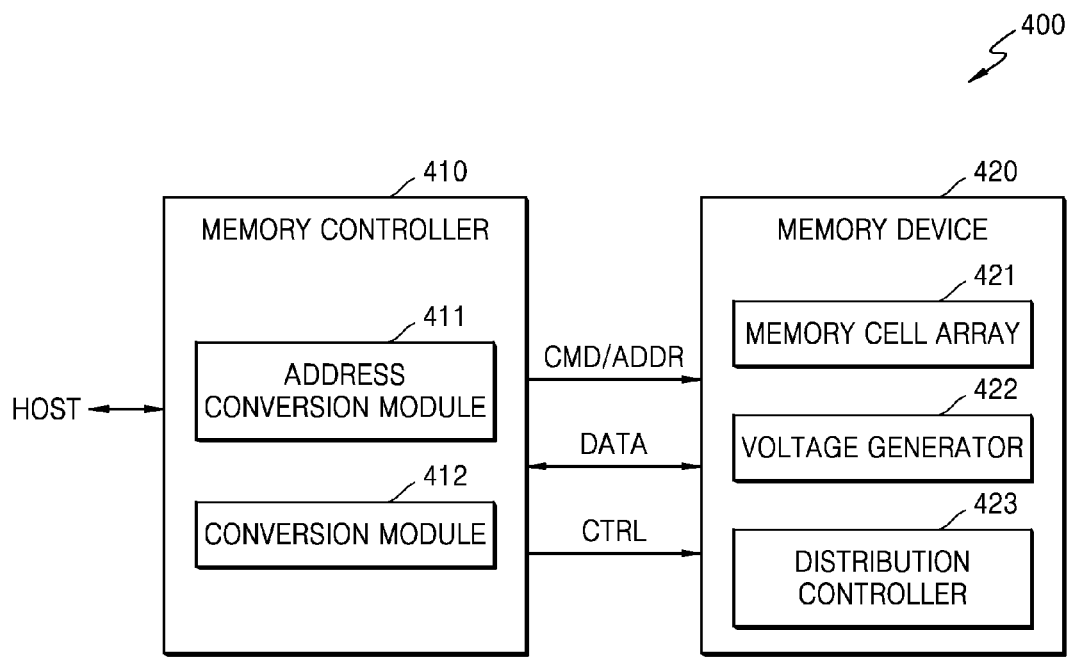

NON-VOLATILE MEMORY DEVICE FOR IMPROVING DATA RELIABILITY AND OPERATING METHOD THEREOF

CROSS-REFERENCE TO RELATED APPLICATION

This U.S. non-provisional patent application claims priority under 35 U.S.C. § 119 to Korean Patent Application No. 10-2017-0166196, filed on Dec. 5, 2017 in the Korean Intellectual Property Office, the disclosure of which is incorporated herein in its entirety by reference.

BACKGROUND

1. Technical Field

The present disclosure relates to a non-volatile memory device. More particularly, the present disclosure relates to a non-volatile memory device for improving data reliability and an operating method thereof.

2. Description of the Related Art

As a type of semiconductor memory device, non-volatile memory devices each include multiple (a plurality of) memory cells which store data even when power is turned off and on. As an example of non-volatile memory devices, flash memory devices may be provided in portable phones, digital cameras, personal digital assistants (PDAs), mobile computer devices, fixed computer devices, and other devices.

Flash memory devices may each include multiple blocks, and each of the blocks may include multiple word lines. In terms of a structure of flash memory devices, characteristics of the word lines in each block may differ. Characteristics of word lines in a certain area (for example, a deterioration area) may be worse than characteristics of word lines in another area (for example, a normal area). Management of the deterioration area is needed for enhancing the data reliability of flash memory devices.

SUMMARY

The present disclosure provides a non-volatile memory device, in which word lines having characteristics reduced in a deterioration area are minimized to thereby enhance data reliability, and a program method of the non-volatile memory device.

According to an aspect of the present disclosure, a non-volatile memory device includes a memory cell array, and a voltage generator. The a memory cell array includes multiple memory cells connected to multiple word lines. Some of the plurality of word lines correspond to a deterioration area which is deteriorated relative to a normal area. The voltage generator is configured to generate a program voltage provided to the memory cells through the word lines. Control logic implemented by the non-volatile memory device is configured to control a program operation and an erase operation on the word lines. The deterioration area includes word lines of a first group where data of at least one first bit is written in each of the memory cells, and word lines of a second group where data of at least two second bits is written in each of the memory cells. The at least two second bits are more than the at least one first bits. The control logic is configured to control a program sequence so that each of the word lines of the second group is programmed after an adjacent word line of the first group is programmed. The control logic is also configured to control a distribution so that a threshold voltage level corresponding to an erase state of each of the word lines of the first group is higher than a threshold voltage level corresponding to the erase state of each of the word lines of the second group.

According to another aspect of the present disclosure, a memory device includes a memory cell array with multiple word lines and a normal area including some of the word lines and a deterioration area including other of the word lines. An operating method of the memory device includes programming data of at least one first bit in each of memory cells connected to word lines of a first group of the deterioration area, programming data of at least two second bits in each of memory cells connected to word lines of a second group of the deterioration area after the programming on the word lines of the first group is completed, and performing programming on the word lines of the normal area. A threshold voltage level corresponding to an erase state of each of the word lines of the first group is higher than a threshold voltage level corresponding to the erase state of each of the word lines of the second group.

According to another aspect of the present disclosure, a memory device includes a memory cell array with a deterioration area including word lines of a first group and word lines of a second group. An operating method of the memory device includes programming data of at least one first bit in each of memory cells connected to the word lines of the first group, programming data of at least two second bits in each of memory cells connected to the word lines of the second group after the programming on the word lines of the first group is completed, performing an erase operation using a first verify voltage on the word lines of the first group, and performing an erase operation using a second verify voltage on the word lines of the second group. A level of the first verify voltage is higher than a level of the second verify voltage, and a threshold voltage level after an erase operation on the word lines of the first group is higher than a threshold voltage level after an erase operation on the word lines of the second group.

BRIEF DESCRIPTION OF THE DRAWINGS

Embodiments of the present disclosure will be more clearly understood from the following detailed description taken in conjunction with the accompanying drawings in which:

FIG. 6 is a table illustrating an example of a program method for memory cells connected to multiple word lines;

FIGS. 9A and 9B are tables showing a program sequence of word lines in a deterioration area, according to example embodiments;

FIGS. 14A and 14B are tables showing various modification examples of a deterioration area and various modification examples of the control of a program sequence;

FIGS. 15A, 15B, 16A, 16B, and 16C are tables showing another example of a program method for memory cells connected to multiple word lines;

FIGS. 17A and 17B are tables showing a memory system and an operating method of the memory system, according to a modifiable embodiment;

DETAILED DESCRIPTION OF THE EMBODIMENTS

Hereinafter, embodiments will be described in detail with reference to the accompanying drawings.

Figure 1:
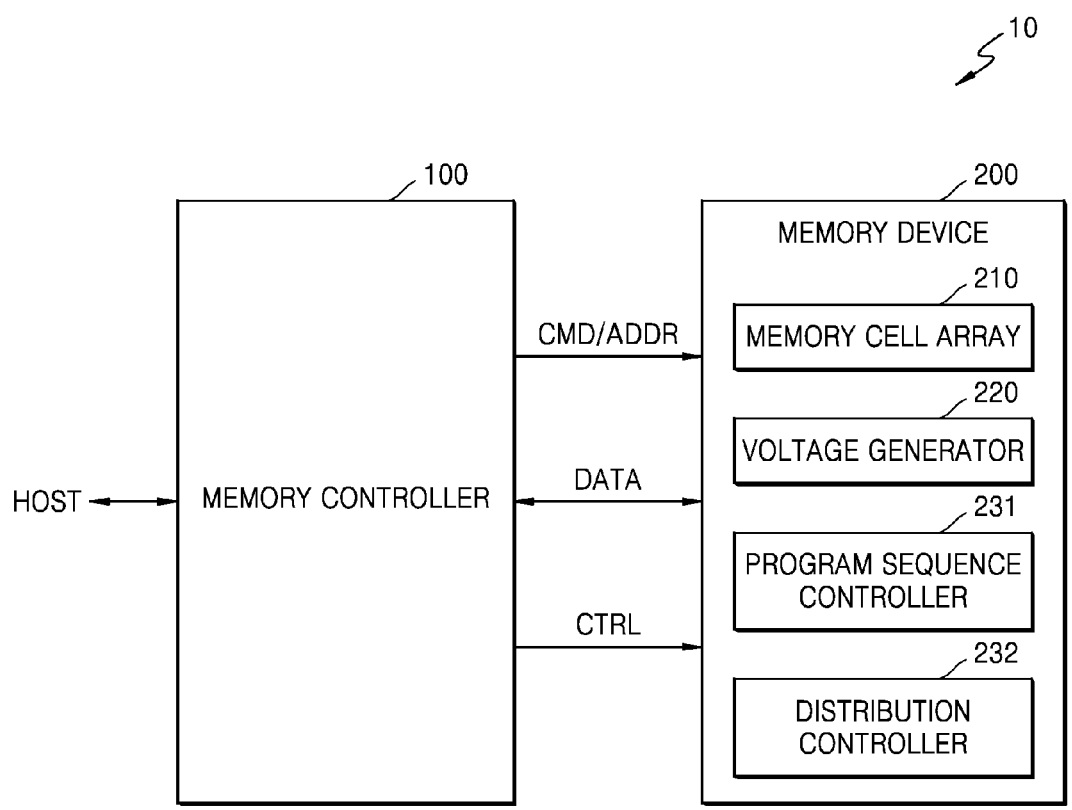
FIG. 1 is a block diagram illustrating a memory system according to an embodiment.

FIG. 1 is a block diagram illustrating a memory system 10 according to an embodiment. Referring to FIG. 1, the memory system 10 may include a memory controller 100 and a memory device 200. The memory device 200 may include a memory cell array 210, a voltage generator 220, a program sequence controller 231, and a distribution controller 232.

Before proceeding, the descriptions herein may refer to a variety of controllers. Any of these controllers may be embodied by a processor that executes a particular dedicated set of software instructions, such as a software module. The processor executes the instructions to control operations of the controllers. Multiple of the controllers may be defined by a single common processor and different dedicated sets of software instructions. Any processor of a controller described herein is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor is configured to execute software instructions in order to perform functions as described in the various embodiments herein. A processor may be a general-purpose processor or may be part of an application specific integrated circuit (ASIC). A processor may also be a microprocessor, a microcomputer, a processor chip, a controller, a microcontroller, a digital signal processor (DSP), a state machine, or a programmable logic device.

A processor may also be a logical circuit, including a programmable gate array (PGA) such as a field programmable gate array (FPGA), or another type of circuit that includes discrete gate and/or transistor logic. A processor may be a central processing unit (CPU), a graphics processing unit (GPU), or both. Additionally, any processor described herein may include multiple processors, parallel processors, or both. Multiple processors may be included in, or coupled to, a single device or multiple devices. Sets of instructions can be read from a computer-readable medium. Further, the instructions, when executed by a processor, can be used to perform one or more of the methods and processes as described herein. In a particular embodiment, the instructions may reside completely, or at least partially, within a main memory, a static memory, and/or within a processor during execution.

In an alternative embodiment, dedicated hardware implementations, such as application-specific integrated circuits (ASICs), programmable logic arrays and other hardware components, can be constructed to implement one or more of the methods implemented by a controller as described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

According to an embodiment, the memory device 200 may be or include a non-volatile memory device. In some embodiments, the memory system 10 may be implemented with or as an internal memory embedded into an electronic device. For example, the memory system 10 may be an embedded universal flash storage (UFS) memory device, embedded multi-media card (eMMC), or solid state drive (SSD). In some embodiments, the memory system 10 may be implemented with an external memory which is detachably attached on/to an electronic device. For example, the external memory may be a UFS memory card, a compact flash (CF) card, a secure digital (SD) card, a micro secure digital (Micro-SD) card, a mini secure digital (Mini-SD) card, an extreme digital (xD) card, or a memory stick.

In response to a write/read request from a host HOST, the memory controller 100 may control the memory device 200 to read data stored in the memory device 200 or to program data in the memory device 200. In detail, the memory controller 100 may provide the memory device 200 with an address ADDR, a command CMD, and a control signal CTRL, thereby controlling a program operation, a read operation, and an erase operation (there are more like this) on the memory device 200. Also, data DATA to program or read may be transmitted or received between the memory controller 100 and the memory device 200.

The memory cell array 210 may include multiple memory cells. The memory cells may be flash memory cells. Hereinafter, a case where the memory cells are NAND flash memory cells will be described as an example of embodiments. However, the present embodiment is not limited thereto, and in some embodiments, the memory cells may be resistive memory cells such as resistive randon-access memory (ReRAM), phase change randon-access memory (PRAM), or magnetic random-access memory (MRAM).

The memory cell array 210 may include multiple cell strings (or NAND strings) respectively connected to points at which multiple string selection lines intersect multiple bit lines. Each of the cell strings may include multiple memory cells. Also, the memory cells included in each cell string may be serially arranged between a string selection transistor and a ground selection transistor. The string selection transistor may be connected to a bit line, and the ground selection transistor may be connected to a common source line. Also, each of the cell strings may extend in a vertical direction from (perpendicular to) a semiconductor substrate (not shown). Thus, each of the cell strings may include multiple memory cells which are vertically arranged with respect to the semiconductor substrate.

To describe an arbitrary cell string as an example, a cell string may have a deterioration area including one or more word lines (or memory cells connected to one or more word lines) due to a structure of the memory cell array 210. The deterioration area may occur due to various causes. For example, some word lines may correspond to the deterioration area due to various causes such as a structure or a driving method of the memory device 200. Word lines may correspond to the deterioration area by being in the deterioration area, and/or by being connected to memory cells in the deterioration area.

The deterioration area may include word lines, disposed at a certain position, of multiple word lines. For example, assuming that memory cells of a string cell are vertically disposed over the semiconductor substrate, multiple word lines disposed adjacent to the semiconductor substrate (or disposed adjacent to the ground selection transistor) may be included in the deterioration area. The deterioration area may be deteriorated specifically due to the proximity to the semiconductor substrate (and/or ground selection transistor). In this case, when multiple data bits are programmed in each of the memory cells, a distribution characteristic of memory cells connected to the word lines included in the deterioration area may be low, which in turn reflects a reduced the data reliability of the deterioration area, causing a reduction in the whole reliability of the memory system 10.

According to example embodiments, in performing programming on the word lines (or the memory cells connected to the word lines) of the deterioration area, the number of data bits programmed in each memory cell is reduced in comparison with word lines of a normal area, thereby enhancing the data reliability of the deterioration area. That is, the number of data bits programmed in memory cells of the deterioration area is reduced in order to enhance the data reliability of the deterioration area. In this case, if the number of data bits programmed in all of the word lines of the deterioration area is reduced, a degree of integration is reduced, and due to this, a chip size increases. Therefore, in an embodiment, in comparison with the normal area, a small number of data bits may be programmed in some word lines (for example, word lines of a first group) of the deterioration area, but data bits equal to the number of data bits programmed in the normal area may be programmed in some other word lines (for example, word lines of a second group) of the deterioration area. Alternatively, in a modifiable embodiment, regardless of the number of data bits programmed in the word lines of the normal area, the number of data bits programmed in each of the word lines of the first group may be less than the number of data bits programmed in each of the word lines of the second group in the deterioration area.

According to an embodiment, the word lines of the first group and the word lines of the second group may be alternately arranged. For example, the word lines of the first group may correspond to even word lines, and the word lines of the second group may correspond to odd word lines. Alternatively, the word lines of the first group may correspond to odd word lines, and the word lines of the second group may correspond to even word lines. That is, in the memory cell array 210, multiple word lines of the second group may be disposed not adjacent to one another, and based on control by the memory system 10, the number of data bits programmed in the word lines of the first group may differ from the number of data bits programmed in the word lines of the second group.

According to an embodiment, the program sequence controller 231 may control a program sequence of the word lines in the deterioration area. For example, when one word line is programmed, interference occurs on another adjacent word line, and due to this, a threshold voltage distribution of the other adjacent word line may vary. For example, in a case where the word lines of the first group are first programmed, interference occurs on the word lines of the second group having an erase state, and due to this, a threshold voltage distribution (for example, an erase-state distribution) of the word lines of the second group may vary. Particularly, there is a high possibility that a threshold voltage distribution characteristic of the word lines of the second group in which a relatively large number of data bits are programmed is deteriorated due to the interference in the deterioration area.

Therefore, according to example embodiments, each of the word lines of the second group may be controlled so as to be programmed after a word line adjacent thereto is first programmed. Thus, interference caused by an adjacent word line is reduced. As an example of sequence control, the program sequence controller 231 may control a program sequence so that programming is first performed on the word lines of the first group, and then, programming is performed on the word lines of the second group. Assuming that the word lines of the first group correspond to even word lines, programming of all of the even word lines may be completed, and then, programming may be performed on even word lines.

In addition, a program sequence may be variously controlled. In a modifiable embodiment, each of the word lines of the second group may be programmed after word lines of the first group adjacent thereto are all programmed. In this case, interference on the word lines of the second group is minimized, and the word lines of the first group and the word lines of the second group may be alternately programmed in the deterioration area.

The word lines of the second group may be affected by a threshold voltage distribution based on programming of the word lines of the first group. For example, a degree of deterioration in a characteristic (e.g., threshold voltage distribution) of the word lines of the second group may be changed by a threshold voltage level corresponding to the erase state and/or a threshold voltage window of the word lines of the first group. The distribution controller 232 may perform a control operation for controlling a threshold voltage distribution of the word lines of the first group. For example, the distribution controller 232 may control the voltage generator 220 which generates various voltage signals applied to a memory operation such as programming or erasing, thereby controlling the threshold voltage distribution of the word lines of the first group.

According to example embodiments, in comparison with a case where the number of data bits programmed in all word lines of the deterioration area is reduced for enhancing data reliability, a degree of data integration is enhanced. Thus, an increase in chip size is prevented. Also, the number of word lines actually deteriorated in the deterioration area is minimized through the control of a program sequence and/or distribution control, thereby enhancing data reliability.

Figure 2A:
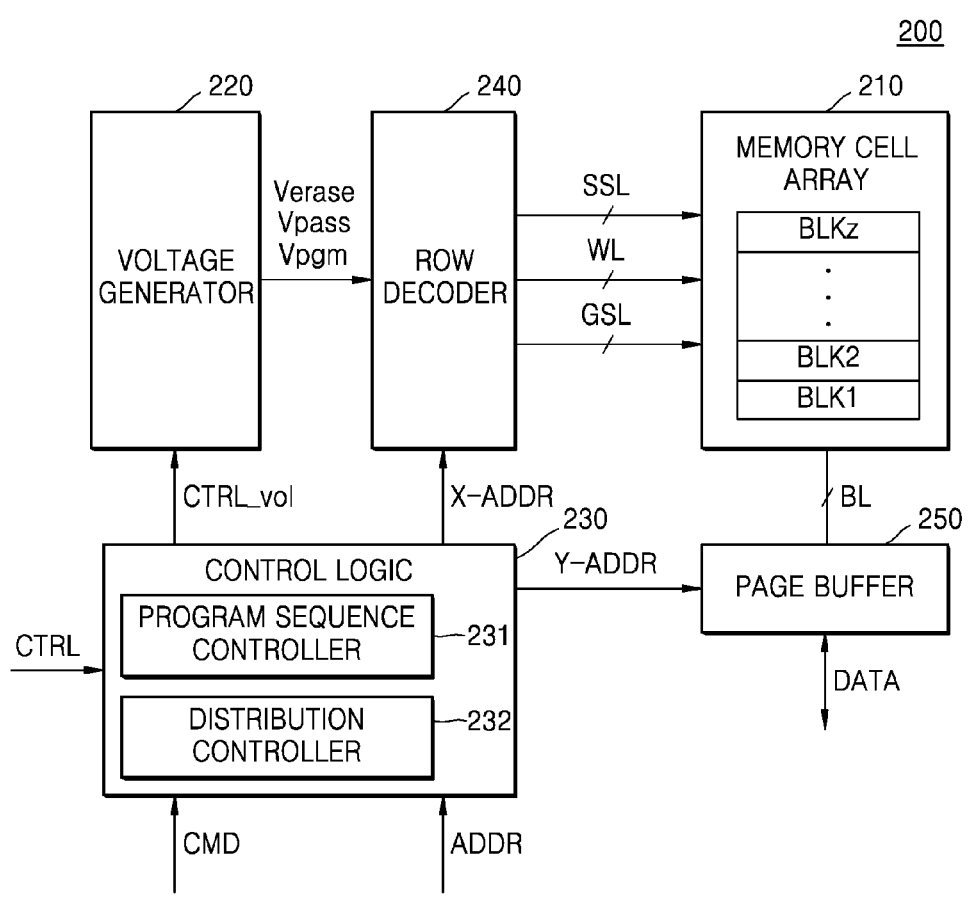
FIGS. 2A and 2B are block diagrams an implementation example of a memory device of FIG. 1.
Figure 2B:
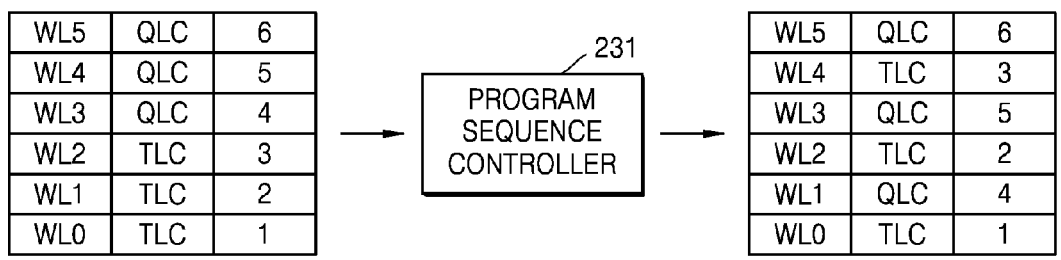

FIGS. 2A and 2B are block diagrams of an implementation example of the memory device 200 of FIG. 1.

Referring to FIGS. 1 and 2A, the memory device 200 may include the memory cell array 210, the voltage generator 220, a control logic 230, a row decoder 240, and a page buffer 250. Although not shown in FIG. 2A, the memory device 200 may further include various elements, associated with a memory operation, such as a data input/output (I/O) circuit or an I/O interface.

The memory cell array 210 may include multiple memory cells and may be connected to multiple word lines WL, multiple string selection lines SSL, multiple ground selection lines GSL, and multiple bit lines BL. The memory cell array 210 may be connected to the row decoder 240 through the word lines WL, the string selection lines SSL, and the ground selection lines GSL and may be connected to the page buffer 250 through the bit lines BL. Each of the memory cells may store one or more bits. Each of the memory cells may correspond to a multi level cell (MLC), a triple level cell (TLC), or a quad level cell (QLC).

In an embodiment, the memory cell array 210 may include a two-dimensional (2D) memory cell array, and the 2D memory cell array may include multiple cell strings arranged in a row direction and a column direction. Also, according to an embodiment, the memory cell array 210 may include a three-dimensional memory cell array (3D memory cell array), and the 3D memory cell array may include multiple cell strings. Each of the cell strings may include multiple memory cells respectively connected to word lines which are vertical stacked on the semiconductor substrate. This will be described below with reference to FIG. 3. The at least one memory cell may include a charge trap layer. U.S. Pat. Nos. 7,679,133, 8,553,466, 8,654,587 and 8,559,235 and U.S. Patent Application No. 2011/0233648 disclose appropriate elements of a 3D memory cell array which includes multiple levels and in which word lines and/or bit lines are shared between the multiple levels. In the present specification, the reference documents may be incorporated herein by reference.

The control logic 230 may be implemented as circuitry (one or more circuit elements). The control logic 230 may also be implemented as a combination of a processor and software executed by the processor, or by a combination of both circuitry and a processor that executes software and the software executed by the processor.

The control logic 230 is implemented by the memory device 200 and may output various internal control signals for programming data in the memory cell array 210 or reading the data from the memory cell array 210, based on a command CMD, an address ADDR, and a control signal CTRL received from the memory controller 100. Also, the voltage generator 220 may generate various voltages used in the memory device 200. For example, the voltage generator 220 may generate a program voltage Vpgm provided to a selected word line for a program operation and an inhibit voltage Vpass provided to unselected word lines. Also, the voltage generator 220 may further generate an erase voltage Verase provided to word lines in an erase operation. Also, although not shown in FIG. 2A, the voltage generator 220 may further generate a string selection voltage (not shown) provided to the string selection lines SSL and a ground selection voltage (not shown) provided to the ground selection lines GSL.

According to an embodiment, the control logic 230 may output a voltage control signal CTRL_vol for controlling levels of various voltages generated by the voltage generator 220. Also, in FIG. 2A, the program sequence controller 231 and the distribution controller 232 according to the above-described embodiment are illustrated as being included in the control logic 230. However, embodiments are not limited thereto, and in other embodiments, the program sequence controller 231 and/or the distribution controller 232 may be provided outside the control logic 230.

The control logic 230 may provide a row address X-ADDR to the row decoder 240 and may provide a column address Y-ADDR to the page buffer 250. In the program operation, in response to the row address X-ADDR, the row decoder 240 may provide the program voltage Vpgm to a word line of a selected memory cell and may provide the inhibit voltage Vpass to word lines of unselected memory cells.

A program sequence of word lines in the deterioration area may be controlled according to control by the control logic 230 or the program sequence controller 231. For example, as described above, the word lines of the deterioration area may include the word lines of the first group where a relatively small number of data bits are programmed and the word lines of the second group where a relatively large number of data bits are programmed. For example, the word lines of the first group and the word lines of the second group may be alternately arranged. In order to decrease a possibility that a threshold voltage distribution of the word lines of the second group is deteriorated, a program sequence may be controlled so that the word lines of the first group are first programmed, and then, the word lines of the second group are programmed.

The voltages Vpgm, Vpass, and Verase generated by the voltage generator 220 may be controlled based on control by the control logic 230 or the distribution controller 232. Thus, a threshold voltage distribution of the word lines in the deterioration area may be controlled. For example, as described above, in the deterioration area, a deterioration possibility of the threshold voltage distribution of the word lines of the second group where a number of data bits are programmed is high. In order to minimize an influence on the threshold voltage distribution of the word lines of the second group, the threshold voltage distribution of the word lines of the first group may be controlled. According to an embodiment, in the program operation on the word lines of the first group, a threshold voltage distribution may be controlled to minimize a threshold voltage window "Δ Vth window" corresponding to a voltage level difference between a threshold voltage corresponding to the erase state and a threshold voltage corresponding to a highest program state.

Moreover, the threshold voltage distribution of the word lines of the first group may be controlled in order for levels of threshold voltages corresponding to the erase state of the word lines of the first group to be higher than those of threshold voltages corresponding to the erase state of the word lines of the second group. Alternatively, the threshold voltage distribution of the word lines of the first group may be controlled to narrow a width of a threshold voltage distribution corresponding to the erase state of the word lines of the first group. A deterioration possibility of the threshold voltage distribution of the word lines of the second group is reduced by controlling the threshold voltage distribution of the word lines of the first group.

FIG. 2B illustrates an example of a control operation of the program sequence controller 231. For example, in FIG. 2B, a TLC program example and a QLC program example are illustrated.

The memory controller 100 may provide the memory device 200 with data and an address for programming some word lines of the deterioration area according to a TLC method and programming some other word lines according to a QLC method. The program sequence controller 231 may perform programming according to the above-described embodiments through a program sequence control operation. For example, the program sequence controller 231 may program the word lines of the first group according to the TLC method and program the word lines of the second group according to the QLC method, based on an address conversion operation. In this case, the program sequence controller 231 may program the word lines of the second group after the programming of the word lines of the first group is completed.

For example, the memory controller 100 may sequentially provide a program command to first to sixth word lines WL0 to WL5. In this case, a TLC-based program command may be provided to some word lines WL0 to WL2, and a QLC-based program command may be provided to some other word lines WL3 to WL5. The program sequence controller 231 may convert an address representing the second word line WL1 into an address representing the third word line WL2 through an address conversion operation by the memory controller 100. Also, the program sequence controller 231 may convert the address representing the third word line WL2 into an address representing the fifth word line WL4.

Based on the address conversion operation illustrated in FIG. 2B, TLC-based data may be first written in word lines of the first group corresponding to even word lines WL0, WL2, and WL4. Subsequently, QLC-based data may be written in word lines of the second group corresponding to odd word lines WL1, WL3, and WL5. Based on such an operation, the word lines of the first group and the word lines of the second group may be alternately arranged in the deterioration area of the memory cell array 210, and a program operation on the word lines of the first group may be first performed.

Figure 3:
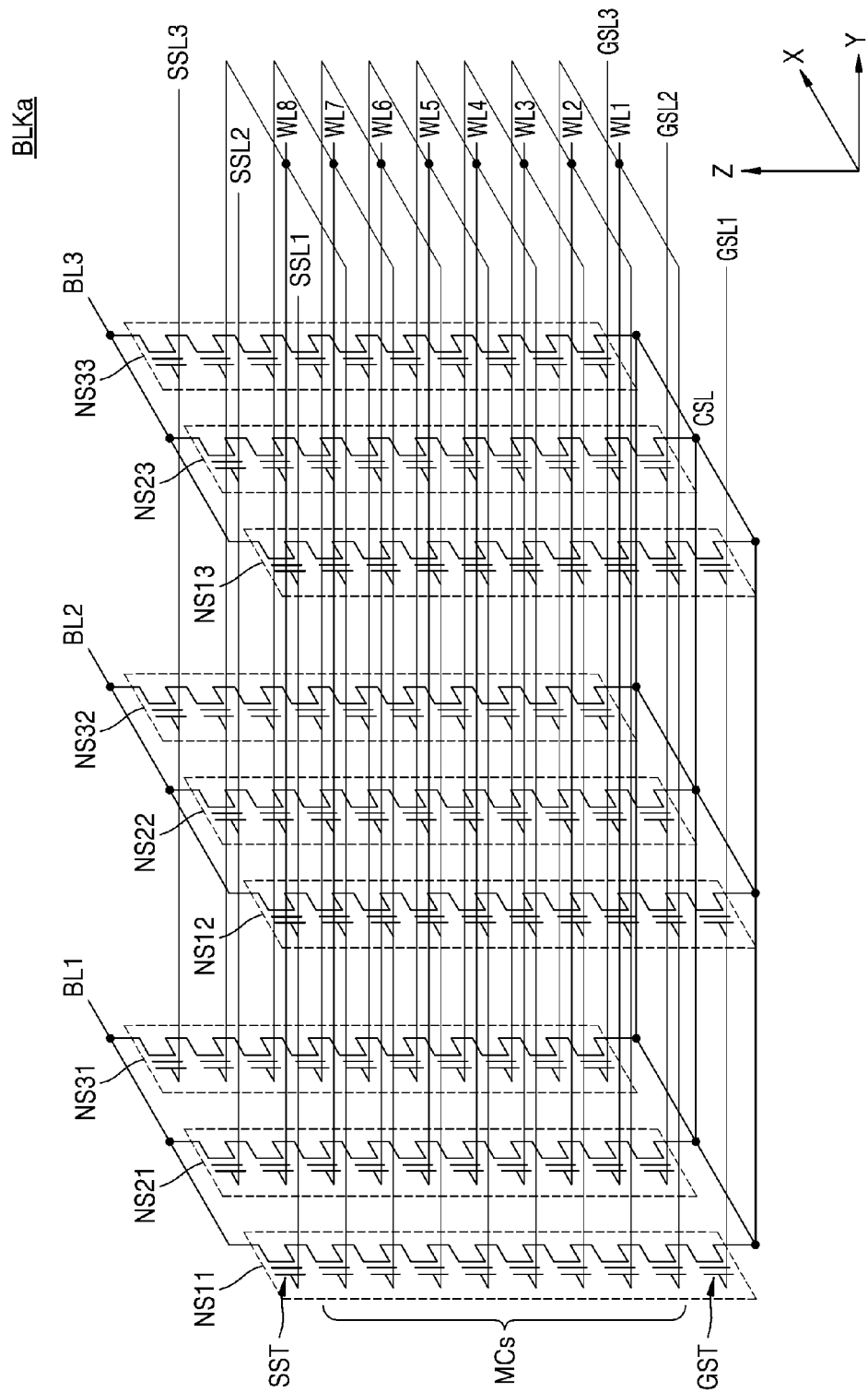
FIG. 3 is a circuit diagram illustrating an example of an equivalent circuit of a memory block implemented in a three-dimensional (3D) structure.

FIG. 3 is a circuit diagram illustrating an example of an equivalent circuit of a memory block implemented in a 3D structure.

Referring to FIG. 3, an ath memory block BLKa may include multiple cell strings NS11 to NS33, multiple word lines WL1 to WL8, multiple bit lines BL1 to BL3, multiple ground selection lines GSL1 to GSL3, multiple string selection lines SSL1 to SSL3, and a common source line CSL. Here, the number of cell strings, the number of word lines, the number of bit lines, the number of ground selection lines, and the number of string selection lines may be variously changed according to embodiments.

The cell strings NS11, NS21, and NS31 may be provided between a first bit line BL1 and the common source line CSL, the cell strings NS12, NS22, and NS32 may be provided between a second bit line BL2 and the common source line CSL, and the cell strings NS13, NS23, and NS33 may be provided between a third bit line BL3 and the common source line CSL. Each (for example, NS11) of the cell strings may include a string selection transistor SST, multiple memory cells MC, and a ground selection transistor GST which are serially connected.

The string selection transistor SST may be connected to the string selection lines SSL1 to SSL3 corresponding thereto. The memory cells MC may be respectively connected to the word lines WL1 to WL8 corresponding thereto. The ground selection transistor GST may be connected to the ground selection lines GSL1 to GSL3 corresponding thereto. The string selection transistor SST may be connected to the bit lines BL1 to BL3, and the ground selection transistor GST may be connected to the common source line CSL.

In the present embodiment, word lines (for example, WL1) having the same height may be connected to each other in common, the string selection lines SSL1 to SSL3 having the same height may be separated from one another, and the ground selection lines GSL1 to GSL3 having the same height may be separated from one another. In FIG. 3, the three string selection lines SSL1 to SSL3 are illustrated as sharing a word line located at the same height, but the present embodiment is not limited thereto. For example, two string selection lines may share a word line located at the same height. As another example, four string selection lines may share a word line located at the same height.

In implementing a memory block having a 3D structure according to the embodiment of FIG. 3, multiple pillars may be formed, and a diameter of each of the pillars may be changed based on a height thereof in terms of a process of manufacturing a memory device. Based on a structure of the memory device, the above-described deterioration area may be variously located in the ath memory block BLKa. For example, in each of the cell strings, the deterioration area may be an area including memory cells MCs connected to one or more word lines (or word lines disposed at a low position) adjacent to the ground selection transistor GST.

The memory block having the 3D structure illustrated in FIG. 3 is merely an implementation example, and the memory block according to embodiments may be variously changed. For example, a dummy word line connected to one or more dummy cells may be further included in the memory block. For example, one or more dummy word lines may be disposed under a first word line WL1, and moreover, one or more dummy word lines may be disposed on an eighth word line WL8.

Figure 4:
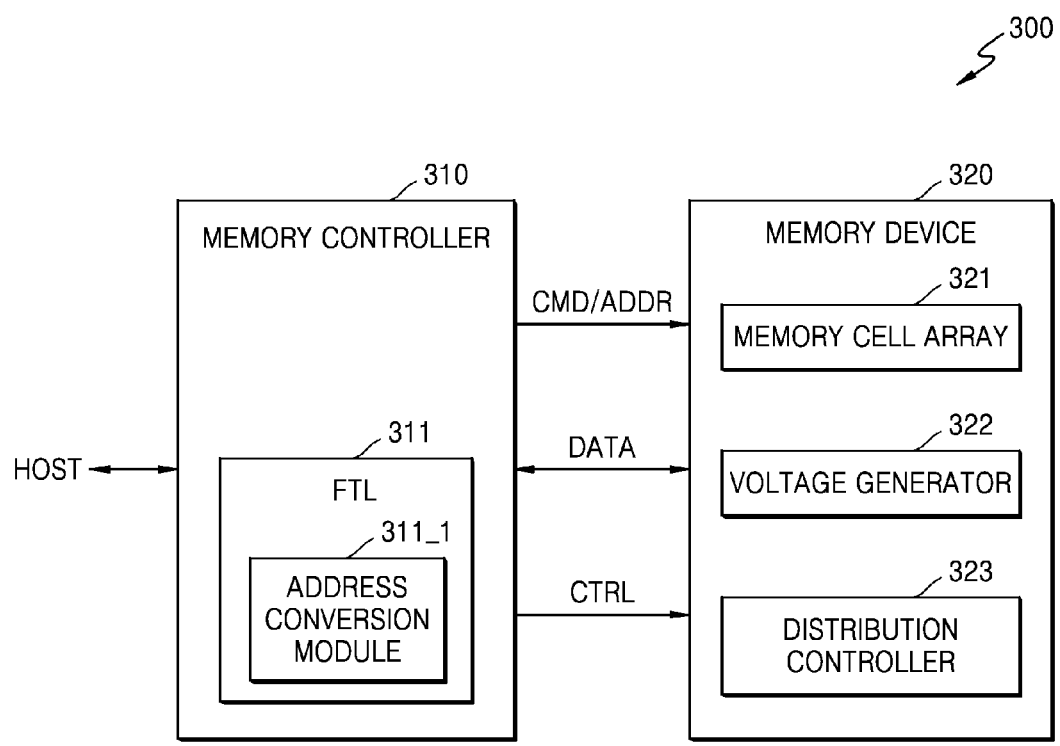
FIG. 4 is a block diagram illustrating a memory system according to an embodiment.

FIG. 4 is a block diagram illustrating a memory system 300 according to an embodiment.

Referring to FIG. 4, the memory system 300 may include a memory controller 310 and a memory device 320. The memory device 320 may include a memory cell array 321, a voltage generator 322, and a distribution controller 323. Also, the memory controller 310 may include a FTL 311 (flash translation layer), and the FTL 311 may include an address conversion module 311_1.

The FTL 311, firmware, may be loaded into a working memory (not shown) in the memory controller 310 and may perform various management operations on the memory device 320. The address conversion module 311_1 may perform an operation of converting a logical address from a host into a physical address which is to be provided to the memory device 320, in response to a data write/read request from the host.

According to an embodiment illustrated in FIG. 4, the program sequence control operation according to the above-described embodiment may be performed by the memory controller 310. For example, word lines of a deterioration area in the memory cell array 321 may be programmed in a changed sequence according to embodiments, and at this time, a program sequence of the word lines of the deterioration area may be controlled based on control by the address conversion module 311_1 of the FTL 311. That is, in the deterioration area of the memory cell array 321, word lines of a first group and word lines of a second group may be alternately arranged, and based on control by the memory controller 310, the word lines of the second group may be programmed after all of the word lines of the first group are programmed.

The program sequence control operation of the memory controller 310 may be performed along with a threshold voltage distribution control operation by the distribution controller 323 of the memory device 320, for reducing the deterioration in threshold voltage distribution characteristic of the word lines of the second group in the deterioration area.

Figure 5A:
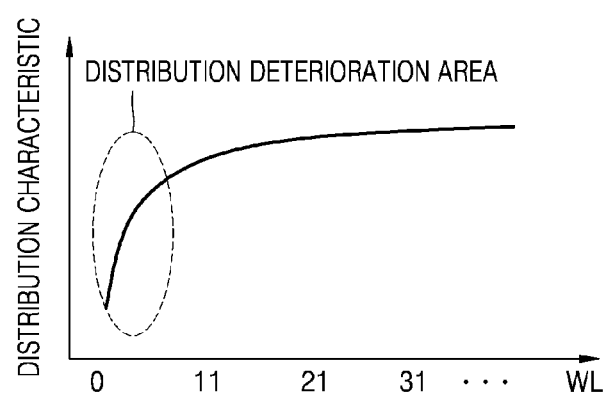
FIGS. 5A and 5B are diagrams illustrating an example of a deterioration area occurring in a memory cell array.
Figure 5B:
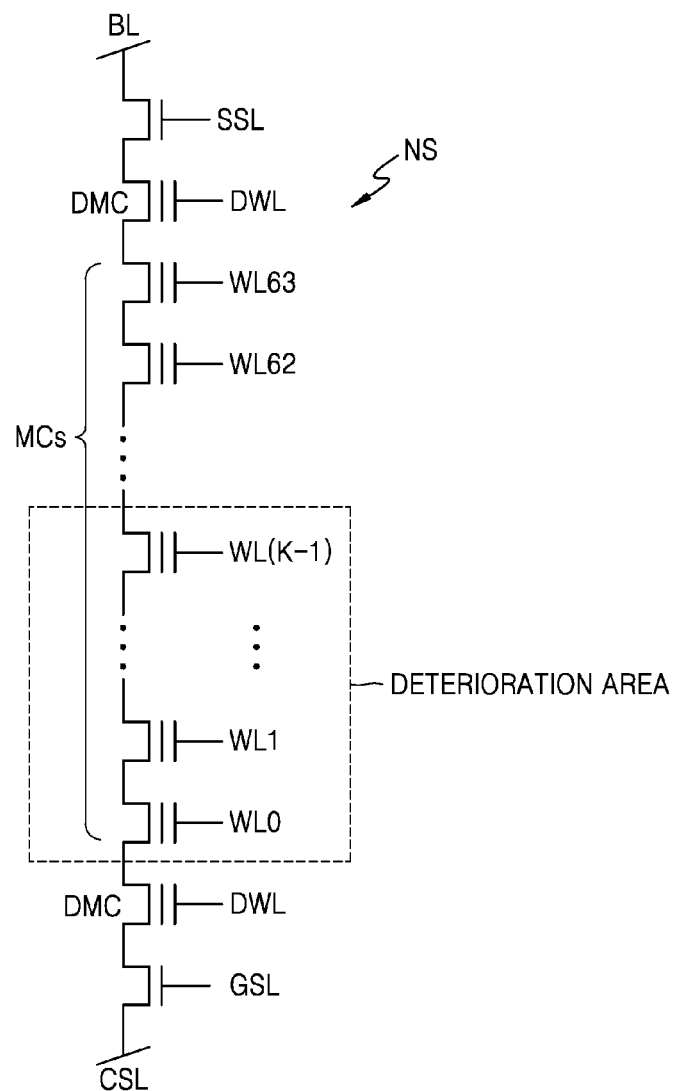

FIGS. 5A and 5B are diagrams illustrating an example of a deterioration area occurring in a memory cell array.

Referring to a graph of FIG. 5A, multiple word lines have different threshold voltage distribution characteristics, and as the word lines have a high value on the Y axis, the threshold voltage distribution characteristic is good. Referring to FIG. 5A, a threshold voltage distribution characteristic of some word lines (for example, word lines located at a relatively low position in a 3D memory cell array) is low, and for example, it is assumed that a threshold voltage distribution characteristic of at least two word lines (K word lines) WL0 to WL(K−1) is low.

Referring to a cell string of FIG. 5B, one cell string NS may include a string selection transistor SST connected to a string selection line SSL, a dummy cell DMC connected to one or more dummy word lines DWL, memory cells MCs connected to multiple word lines WL0 to WL63, and a ground selection transistor GST connected to the ground selection line GSL. The string selection transistor SST may be connected to a bit line BL, and the ground selection transistor GST may be connected to a common source line CSL.

In the cell string, some word lines may be included in the deterioration area. The number of word lines included in the deterioration area may be variously set. For example, the number of word lines included in the deterioration area may be a predetermined number. Alternatively, characteristics (for example, a threshold voltage distribution characteristic) of the word lines WL0 to WL63 may be determined through a test which is performed when initializing a memory device. Thus, the number and/or positions of the word lines included in the deterioration area may be changed.

FIG. 6 is a table illustrating an example of a program method for multiple word lines. In FIG. 6, cell strings connected to multiple string selection lines SSL1 to SSL4 are illustrated, and a program state of each of dummy cells connected to two dummy word lines DUM1 and DUM2 is further illustrated. Also, in FIG. 6, it may be assumed that first to sixth word lines WL0 to WL5 are included in a deterioration area, but other additional word lines may be further included in the deterioration area.

Referring to FIG. 6, the dummy word lines DUM1 and DUM2 may be programmed based on various methods. For example, a first word line DUM1 located at a lower portion may be programmed based on an SLC method. Also, a second word line DUM2 located at an upper portion may be programmed based on an MLC method. Also, normal word lines may be programmed based on a QLC method.

In the deterioration area, word lines (for example, WL0, WL2, and WL4) of a first group may be programmed based on the TLC method, and word lines (for example, WL1, WL3, and WL5) of a second group may be programmed based on the QLC method identically to the normal word lines. Since the TLC method and the QLC method are alternately applied to word lines in the deterioration area as described above, a program method for the deterioration area may be referred to as a TQTQ method. A program sequence and a threshold voltage distribution of the word lines of the deterioration area may be controlled through the above-described program sequence control operation and distribution control operation.

Embodiments are not limited to the embodiment of FIG. 6. For example, a program method for the dummy word lines DUM1 and DUM2 or a program method for the normal word lines may be variously modified. Also, the word lines of the second group in the deterioration area may be programmed based on a program method which differs from a program method for the word lines of the normal area. For example, in a case where the word lines of the normal area are programmed based on the QLC method, the word lines (for example, WL1, WL3, and WL5) of the second group of the deterioration area may be programmed based on the TLC method, and the word lines (for example, WL0, WL2, and WL4) of the first group may be programmed based on the MLC method. In this case, a program method for the deterioration area may be referred to as an MTMT method.

Figure 7:
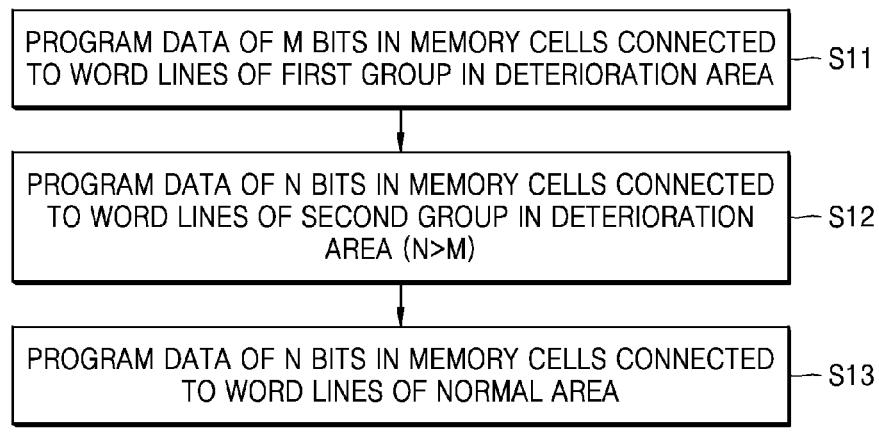
FIGS. 7, 8A, and 8B are flowcharts illustrating an operating method of a memory device according to example embodiments.
Figure 8A:
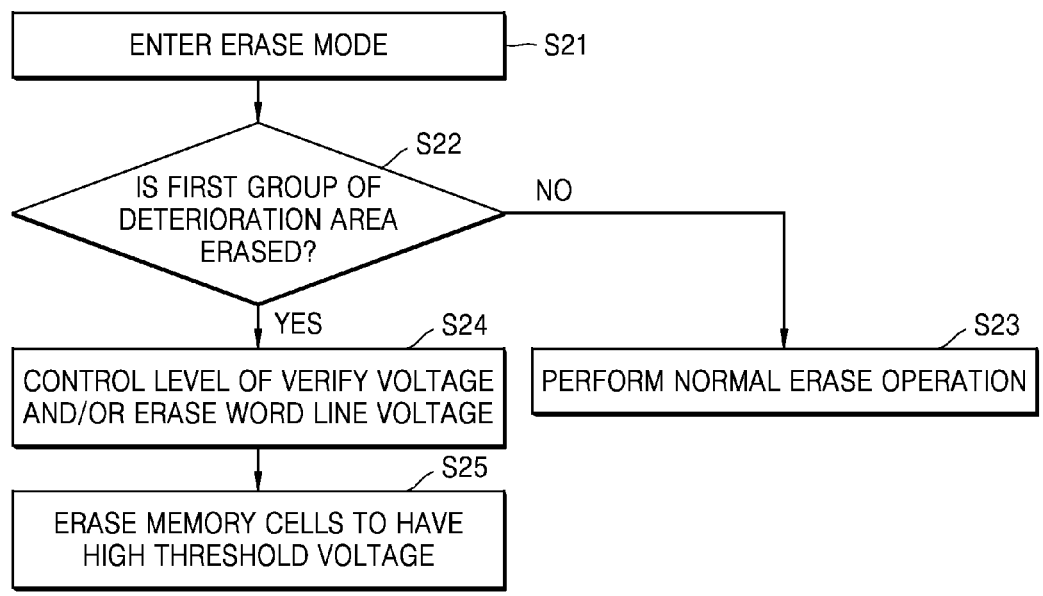
Figure 8B:
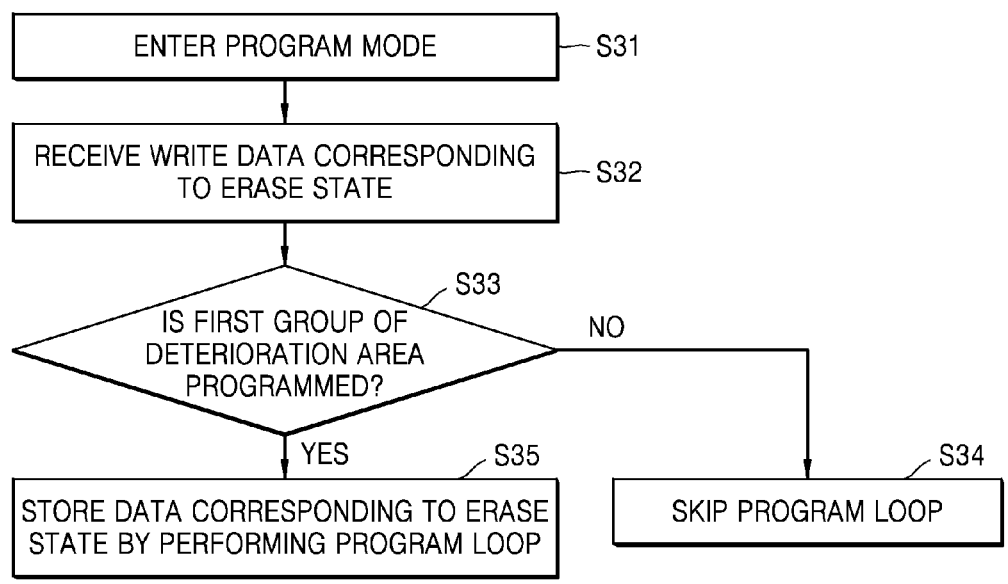

FIGS. 7, 8A, and 8B are flowcharts illustrating an operating method of a memory device according to example embodiments.

Referring to FIG. 7, the memory device may include a memory cell array including multiple word lines, and some of the word lines may correspond to a deterioration area. The word lines of the deterioration area may include word lines of a first group where a relatively small number of data bits are programmed and word lines of a second group where a relatively large number of data bits are programmed.

In performing programming on the word lines of the deterioration area, memory cells connected to the word lines of the first group may be first programmed, and data of M (where M is an integer equal to or more than one) bits may be programmed in each of the memory cells in operation S11. The M bits may be considered first bits. After programming on the word lines of the first group is completed, memory cells connected to the word lines of the second group may be programmed, and data of at least two second (N) bits may be programmed in each of the memory cells in operation S12. The at least two second (N) bits are more than the at least one first (M) bits. Also, after programming on the word lines in the deterioration area is completed, programming may be performed on the other word lines of the normal area. For example, data of the at least two second (N) bits may be programmed in each of memory cells in the normal area in operation S13.

A threshold voltage distribution of the word lines of the first group and a threshold voltage distribution of the word lines of the second group may be separately controlled. In FIG. 8A, a threshold voltage distribution corresponding to an erase state of the word lines of the first group is controlled differently from a threshold voltage distribution corresponding to the erase state of the word lines of the second group.

Referring to FIG. 8A, the memory device may enter an erase mode in operation S21, and may determine whether an erase operation is performed on the word lines of the first group among the word lines of the deterioration in operation S22. When it is determined that the erase operation is performed on the word lines of the second group (S22=No), the erase operation (for example, a normal erase operation) may be performed based on the same method as a method performed on the word lines of the normal area in operation S23.

On the other hand, when it is determined that the erase operation is performed on the word lines of the first group (S22=Yes), a level of each of a verify voltage and/or an erase voltage (for example, an erase word line voltage) provided to the word lines of the first group may be controlled in operation S24. By controlling a voltage level relevant to the erase operation, the threshold voltage distribution corresponding to the erase state of the word lines of the first group may be controlled differently than the threshold voltage distribution corresponding to the erase state of the word lines of the second group. For example, a threshold voltage level corresponding to the erase state of each of the word lines of the first group may have a value which is relatively greater than that of a threshold voltage level corresponding to the erase state of each of the word lines of the second group in operation S25.

In FIG. 8B, an example where a width of the threshold voltage distribution corresponding to the erase state of the word lines of the first group is narrowly controlled is illustrated.

Referring to FIG. 8B, the memory device may enter a program mode in operation S31, and may receive write data from a memory controller. For example, some of the write data may be write data corresponding to the erase state in operation S32. Data corresponding to the erase state of each of the word lines in the first group may be stored in memory cells connected to the word lines of the first group, and data corresponding to the erase state of each of the word lines in the second group may be stored in memory cells connected to the word lines of the second group. As described below, a program loop may be performed in order to store the data corresponding to the erase state of each of the word lines of the first group. On the other hand, a program loop may specifically not be performed in order to store the data corresponding to the erase state of each of the word lines of the second group.

Whether data corresponding to the erase state is written in the word lines of the first group among the word lines of the deterioration area may be determined in operation S33. For example, when it is determined that programming is performed on the word lines of the second group (S33=No), a program loop may not be performed on a memory cell storing the data corresponding to the erase state in operation S34, and the memory cell storing the data corresponding to the erase state may have a threshold voltage after the erase operation is completed. On the other hand, when it is determined that programming is performed on the word lines of the first group (S33=Yes), the program loop may be performed on the memory cell storing the data corresponding to the erase state. Thus, the data corresponding to the erase state may be stored in operation S34. In this case, a width of a threshold voltage distribution of the memory cell storing the data corresponding to the erase state may be narrower in the word lines of the first group than the word lines of the second group, and moreover, a value of a threshold voltage level may be greater in the word lines of the first group than the word lines of the second group.

FIGS. 9A and 9B are tables showing a program sequence of word lines of a deterioration area, according to example embodiments. In FIGS. 9A and 9B, it may be assumed that the deterioration area includes first to seventh word lines WL0 to WL6.

Referring to FIG. 9A, word lines (for example, even word lines WL0, WL2, WL4, and WL6) of a first group in the deterioration area may be programmed based on the TLC method, and word lines (for example, odd word lines WL1, WL3, and WL5) of a second group in the deterioration area may be programmed based on the QLC method.

In programming the word lines of the deterioration area, the word lines WL0, WL2, WL4, and WL6 of the first group may be first programmed, and then, the word lines WL1, WL3, and WL5 of the second group may be programmed. For example, assuming that a memory cell array is programmed based on a bottom to top method, a first word line WL0, a third word line WL2, a fifth word line WL4, and a seventh word line WL6 may all be sequentially programmed, and then, a second word line WL1, a fourth word line WL3, and a sixth word line WL5 may be programmed.

Referring to FIG. 9B, a program sequence may be controlled so that each of the word lines WL1, WL3, and WL5 of the second group is programmed after word lines of the first group adjacent thereto are first programmed. For example, the second word line WL1 may be programmed after the first word line WL0 and the third word line WL2 are programmed, and then, the fifth word line WL4 may be programmed. Subsequently, the fourth word line WL3 may be programmed, and then, the seventh word line WL6 and the sixth word line WL5 may be sequentially programmed.

Figure 10:
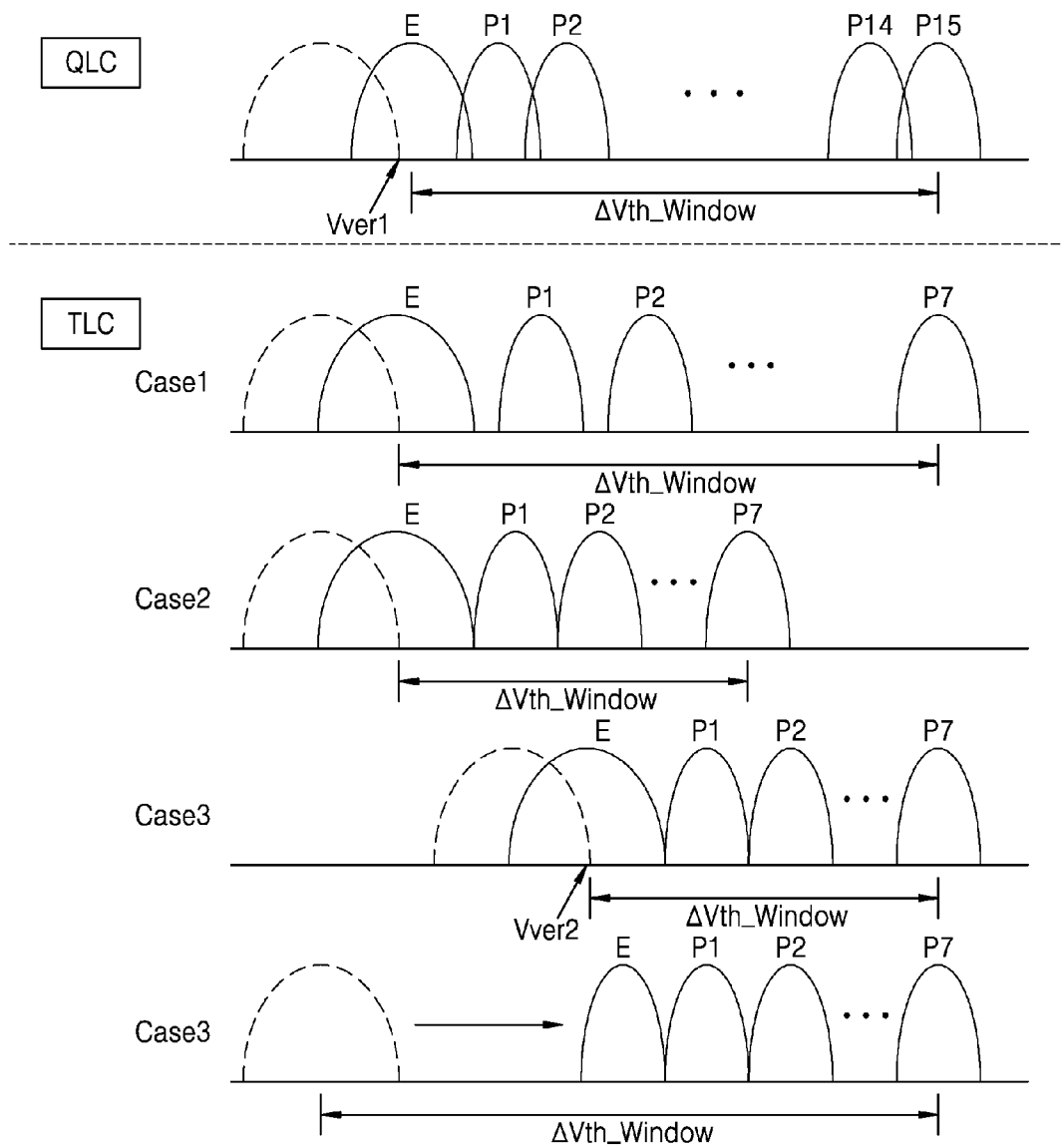
FIG. 10 is a graph showing an example which controls a threshold voltage distribution of word lines in a deterioration area.

FIG. 10 is a graph showing an example which controls a threshold voltage distribution of word lines in a deterioration area. In FIG. 10, an example where the word lines of the deterioration area are programmed based on the QLC method and the TLC method is illustrated. Also, word lines of a first group programmed based on the TLC method may have various kinds of distributions, based on a threshold voltage distribution control method. In FIG. 10, four (Case1 to Case4) threshold voltage distributions are illustrated.

Referring to FIG. 10, the word lines of the first group in the deterioration area may be programmed based on the TLC method. Thus, the word lines of the first group may have eight threshold voltage distributions. For example, the word lines of the first group may include a threshold voltage distribution corresponding to an erase state E and threshold voltage distributions respectively corresponding to first to seventh program states P1 to P7. Also, word lines of a second group in the deterioration area may be programmed based on the QLC method, and thus, may have sixteen threshold voltage distributions. For example, the word lines of the second group may include a threshold voltage distribution corresponding to the erase state E and threshold voltage distributions respectively corresponding to first to fifteenth program states P1 to P15. In threshold voltage distributions illustrated in FIG. 10, a threshold voltage distribution corresponding to an erase state E illustrated by a dashed line represents a threshold voltage distribution after an erase operation is performed, and a threshold voltage distribution corresponding to an erase state E illustrated by a solid line represents a threshold voltage distribution after interference occurs due to a program operation on adjacent word lines.

According to example embodiments, a threshold voltage distribution of the word lines of the first group may be controlled based on one of first to fourth cases Case1 to Case4. Referring to the first case Case1, the first case Case1 may represent a threshold voltage distribution for a program operation based on the TLC method, and in this case, a threshold voltage distribution corresponding to an erase state E may have a relatively low threshold voltage level and a large width. Also, a threshold voltage window "Δ Vth window" in the first case Case1 may have a relatively large value. In order to decrease a degree of reduction in data retention characteristic of the word lines of the second group, a distribution control operation may be performed in order for the word lines of the first group to have threshold voltage distributions based on the second to fourth cases Case2 to Case4 of FIG. 10.

Referring to the second case Case2, a program operation may be performed in order for a threshold voltage window "Δ Vth window" of each of the word lines of the first group to have a small value. For example, the program operation may be performed so that a level of a threshold voltage corresponding to the seventh program state P7 having a highest threshold voltage is relatively low. As a threshold voltage window "Δ Vth window" increases, a threshold voltage distribution corresponding to an erase state E of the word lines of the second group may largely vary. That is, a threshold voltage window "Δ Vth window" is less in the second case Case2 than the first case Case1. Thus, a variation of the threshold voltage distribution corresponding to the erase state E of the word lines of the second group is small, whereby a data retention characteristic of word lines of the second group is enhanced.

Referring to the third case Case3, a voltage level of a threshold voltage distribution after performing an erase operation may be relatively higher in the third case Case3 than the first case Case1 and the second case Case2. For example, a voltage level of a threshold voltage distribution corresponding to an erase state E may be controlled based on areas or word lines in the erase operation, and in the erase operation on the word lines of the first group, by controlling an erase voltage and/or a verify voltage level applied to a word line, a threshold voltage level corresponding to the erase state E of each of the word lines of the first group may be larger controlled in the third case Case3 than the first case Case1 and the second case Case2.

For example, based on programming on the word lines of the first and second groups, a memory cell connected to each of the word lines of the second group may have the fifteenth program state P15, a memory cell connected to each of word lines of the first group adjacent thereto may have the erase state E, and a threshold voltage level difference between the fifteenth program state P15 and the erase state E may be large. In this case, charge loss occurs in a memory cell which corresponds to the fifteenth program state P15 and is connected to each of the word lines of the second group, and thus, a threshold voltage may vary. However, the threshold voltage level difference between the fifteenth program state P15 and the erase state E may be reduced by the third case Case3. Thus, a data retention characteristic of the word lines of the second group is enhanced.

Moreover, in the third case Case3, a level of a threshold voltage corresponding to the erase state E is high. Thus, a threshold voltage window "Δ Vth window" is less in the third case Case3 than the first case Case1, whereby the data retention characteristic of the word lines of the second group is enhanced.

In the third case Case3, the control of the threshold voltage corresponding to the erase state E may be performed by another method. For example, an erase time applied to the word lines of the first group may be set differently from an erase time applied to the word lines of the second group. Thus, a threshold voltage level corresponding to the erase state E of each of the word lines of the first group may be controlled.

Referring to the fourth case Case4, in performing programming on the word lines of the first group, the program loop may be performed when storing data corresponding to an erase state. In this case, a voltage level of a threshold voltage distribution corresponding to an erase state E may increase, and moreover, a width of the threshold voltage distribution corresponding to the erase state E may be narrowed. According to the fourth case Case4, since the voltage level of a threshold voltage distribution corresponding to the erase state E increases and the width of the threshold voltage distribution corresponding to the erase state E is narrowed, a threshold voltage level difference between the fifteenth program state P15 of the word lines of the second group and the erase state E of the word lines of the first group is reduced, and the data retention characteristic of the word lines of the second group is enhanced.

Figure 11:
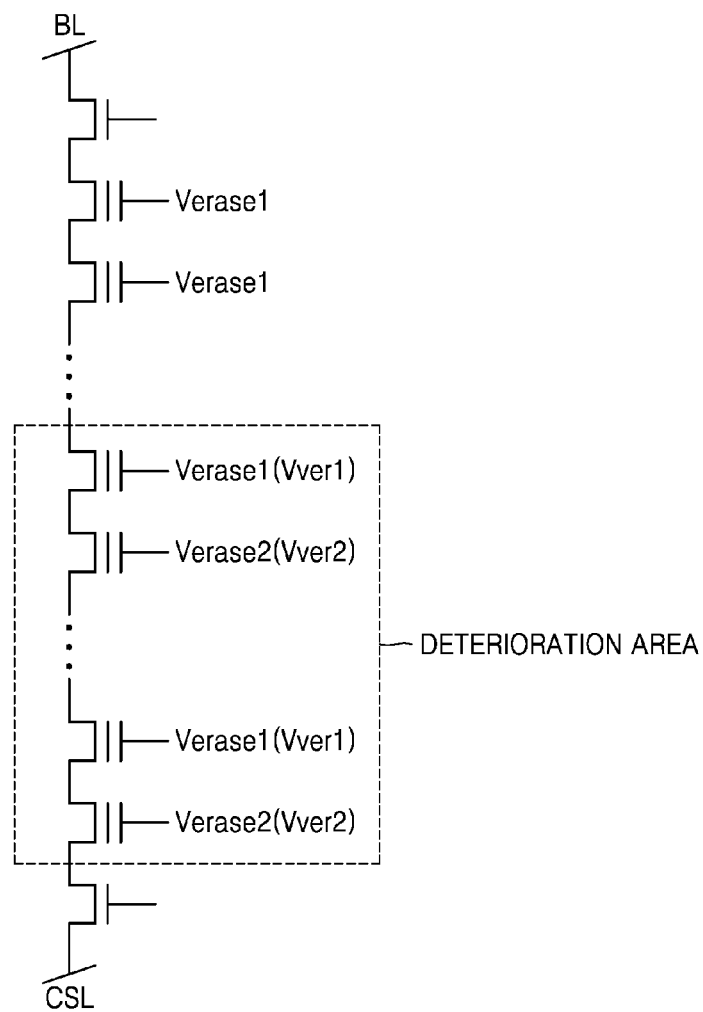
FIG. 11 is a circuit diagram illustrating an example which controls a threshold voltage distribution in a third case of FIG. 10.

FIG. 11 is a circuit diagram illustrating an example which controls a threshold voltage distribution in the third case Case3 of FIG. 10. In FIG. 11, one cell string is illustrated, and an example where multiple word lines disposed in a lower portion correspond to a deterioration area is illustrated.

Referring to FIG. 11, in performing an erase operation on multiple word lines included in a cell string, a high voltage may be applied to a channel corresponding to the cell string, and a first erase voltage Verase1 may be applied to a word line in a normal area. Also, in a deterioration area, the first erase voltage Verase1 may be applied to word lines of a second group programmed based on the QLC method, and a verification operation using a first verify voltage Vver1 may be performed in a verification operation.

On the other hand, in the deterioration area, a second erase voltage Verase2 having a level higher than that of the first erase voltage Verase1 may be applied to word lines of a first group programmed based on the TLC method, and a verification operation using a second verify voltage Vver2 having a level higher than that of the first verify voltage Vver1 may be performed in the verification operation. Therefore, a level difference between a voltage applied to the word lines of the first group and a high voltage applied to the channel may be relatively small, and the verification operation may be performed based on the second erase voltage Verase2 having a level higher than that of the first erase voltage Verase1, whereby a threshold voltage level corresponding to an erase state E of each of the word lines of the first group may have a value which is relatively greater than that of a threshold voltage level corresponding to the erase state E of each of the word lines of the second group.

Figure 12:
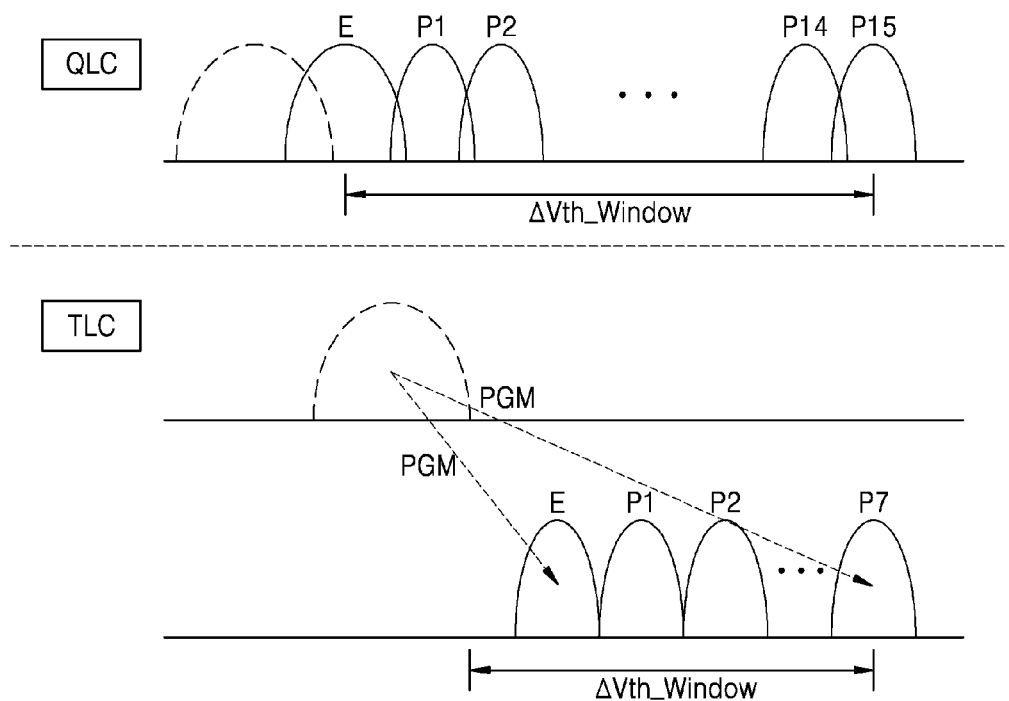
FIG. 12 is a graph showing an example where a threshold voltage distribution of word lines of a first group is controlled by a combination of third and fourth cases in FIG. 10.

FIG. 12 is a graph showing an example where a threshold voltage distribution of word lines of a first group is controlled by a combination of the third and fourth cases Case3 and Case4 in FIG. 10.

As in the above-described embodiment, in order to enhance a data retention characteristic of word lines of a second group, a voltage level of a threshold voltage distribution corresponding to an erase state E of each of word lines of a first group in a deterioration area may be high, and moreover, a width of the threshold voltage distribution may be narrow. Therefore, in the present embodiment, a threshold voltage level after an erase operation on the word lines of the first group may be relatively high controlled through the erase operation corresponding to the third case. Also, in further applying the method illustrated in the fourth case, a program loop may be performed in storing data corresponding to the erase state in a memory cell. Thus, a width of a threshold voltage distribution corresponding to the erase state E may be further narrowed.

Figure 13:
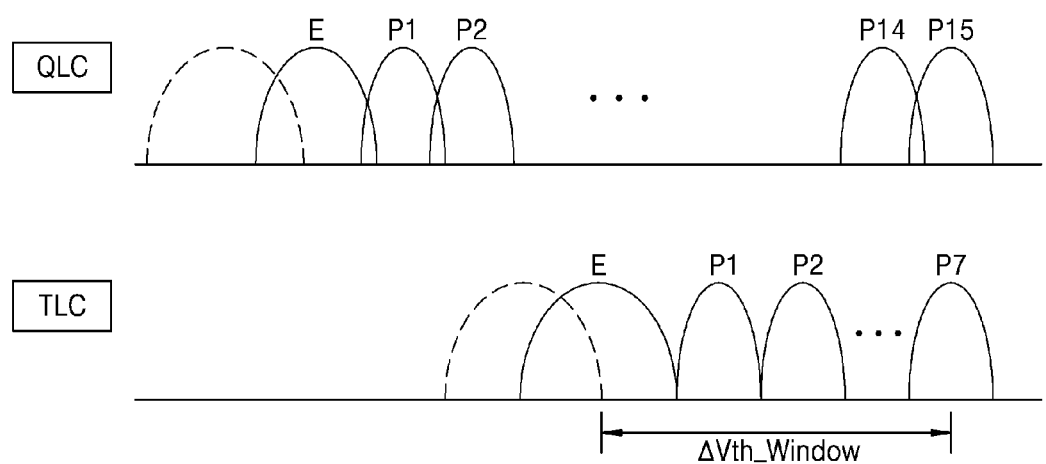
FIG. 13 is a graph showing an example where a threshold voltage distribution corresponding to an erase state of the word lines of the first group is controlled by the third case in FIG. 10.

FIG. 13 is a graph showing an example where a threshold voltage distribution corresponding to an erase state of the word lines of the first group is controlled by the third case or the fourth case in FIG. 10.

Referring to FIG. 13, word lines of a second group in a deterioration area may be programmed based on the QLC method, and word lines of a first group in the deterioration area may be programmed based on the TLC method. Also, an erase operation on the word lines of the first group may be performed based on an erase voltage and/or a verify voltage which differ(s) from the word lines of the second group. Thus, a threshold voltage level corresponding to an erase state E of each of the word lines of the first group may be higher than a threshold voltage level corresponding to the erase state E of each of the word lines of the second group. For example, the threshold voltage level corresponding to the erase state E of each of the word lines of the first group may have a value which is greater than that of a threshold voltage level corresponding to a first program state P1 of each of the word lines of the second group.

According to an embodiment illustrated in FIG. 13, in controlling a voltage level of a distribution corresponding to the erase state E of the word lines of the first group, a program state (for example, the first program state P1) of one of the word lines of the second group may be referenced, and the threshold voltage level corresponding to the erase state E of each of the word lines of the first group may be variously controlled based on program states of the referenced word lines of the second group.

Figure 14A:
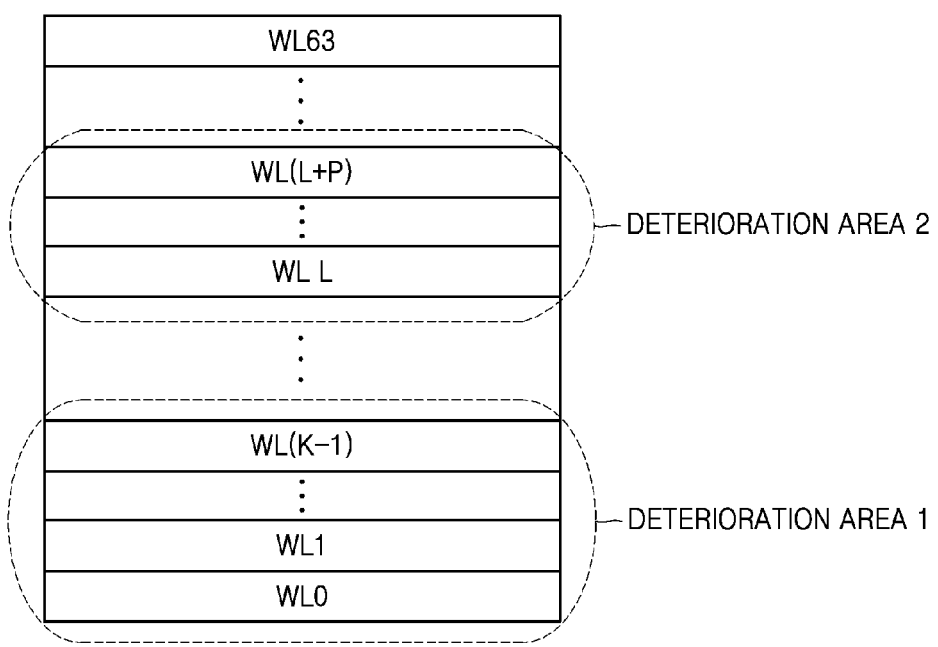

FIGS. 14A and 14B are tables showing various modification examples of a deterioration area and various modification examples of the control of a program sequence. In FIG. 14A, an example where the number of word lines is 64 is illustrated. In FIG. 14B, it is assumed that a deterioration area includes first to seventh word lines WL0 to WL6.

Referring to FIG. 14A, a deterioration area in a memory cell array may be variously defined. In the deterioration area, a program operation and an erase operation may be controlled according to the above-described embodiment. For example, the deterioration area may include word lines of a first group where a relatively small number of data bits are programmed and word lines of a second group where a relatively large number of data bits are programmed.

The memory cell array may include one or more deterioration areas. When the memory cell array is assumed as including memory cells having a vertical structure, at least two (K) word lines WL0 to WL(K−1) located in a relatively lower portion may correspond to a deterioration area (for example, a first deterioration area).

Moreover, a characteristic of word lines in a certain area of the memory cell array is reduced due to various causes such as a manufacturing process and driving of a device, and word lines with reduced characteristic may be defined as a deterioration area. For example, P+1 number of word lines WLL to WL(L+P) located in an approximate center portion of the memory cell array may correspond to a deterioration area (for example, a second deterioration area). In FIG. 14A, two deteriorations are illustrated, but in the memory cell array, only the P+1 word lines WLL to WL(L+P) may be defined as a deterioration area. Also, the deterioration area may include word lines located in an upper portion of the memory cell array.

Referring to FIG. 14B, programming on the memory cell array may be performed by a top to bottom method, and in this case, programming may be performed in a direction from a word line located at a relatively upper portion to a word line located at a lower portion. In this case, in the deterioration area, a seventh word line WL6 may be first programmed, and then, a first word line WL0 may be programmed.

In this case, as in the above-described embodiment, word lines WL0, WL2, WL4, and WL6 of the first group may be first programmed, and then, word lines WL1, WL3, and WL5 of the second group may be programmed. Accordingly, a seventh word line WL6, a fifth word line WL4, a third word line WL2, and a first word line WL0 may all be sequentially programmed, and then, a sixth word line WL5, a fourth word line WL3, and a second word line WL1 may be programmed.

FIGS. 15A, 15B, 16A, 16B, and 16C are tables showing another example of a program method for memory cells connected to multiple word lines. In FIGS. 15A, 15B, 16A, 16B, and 16C, multiple string selection lines SSL1 to SSL4 are illustrated, and a programming method for dummy word lines DUM1 and DUM2 are further illustrated. However, this is for reference, and the present embodiment is not limited thereto. Also, in the embodiment of FIGS. 15A, 15B, 16A, 16B, and 16C, first to seventh word lines WL0 to WL6 may be assumed as being included in a deterioration area, but other additional word lines may be further included in the deterioration area.

Referring to FIG. 15A, the number of word lines of a first group may be set differently from the number of word lines of a second group. For example, the word lines of the second group may be programmed based on the QLC method, the word lines of the first group programmed based on the TLC method may be disposed adjacent to the word lines of the second group, and each of the word lines of the first group may be disposed on one of two word lines of the second group vertically adjacent thereto and under the other word line of the second group. For example, the first and second word lines WL0 and WL1 may correspond to the word lines of the first group, the third word line WL3 adjacent thereto may correspond to the word line of the second group, the fourth and fifth word lines WL3 and WL4 thereon may correspond to the word lines of the first group, the sixth word line WL5 thereon may correspond to the word line of the second group, and the seventh word line WL6 thereon may correspond to the word line of the first group.

Referring to FIG. 15B, as in the above-described graph of FIG. 15A, a characteristic of word lines located in a relatively lower portion in a deterioration area may be lower. Therefore, a certain number of word lines (for example, first to fourth word lines WL0 to WL3) located in a lower portion in the deterioration area may correspond to word lines of a first group. Also, in word lines on the certain word lines located in the lower portion in the deterioration area, the word lines of the first group and word lines of a second group may be alternately arranged according to the above-described embodiment. For example, fifth and seventh word lines WL4 and WL6 may correspond to the word lines of the second group, and a sixth word line WL5 may correspond to the word line of the first group.

A data program method in a deterioration area may be variously modified. Referring to FIG. 16A, word lines of a normal area may be programmed based on the QLC method, but word lines of the deterioration area may be programmed based on the TLC method and the MLC method. For example, in the deterioration area, the word lines (for example, WL0, WL2, WL4, and WL6) of the first group may be programmed based on the MLC method, but the word lines (for example, WL1, WL3, and WL5) of the second group may be programmed based on the TLC method. That is, the number of data bits stored in a memory cell may be smaller in the word lines of the deterioration area than the word lines of the normal area.

Referring to FIG. 16B, a data program method may be performed in a deterioration area, based on three or more methods. For example, word lines of a normal area may be programmed based on the QLC method, but word lines of the deterioration area may be programmed based on the QLC method, the TLC method, the MLC method, and the SLC method. For example, word lines (for example, WL0, WL2, WL4, and WL6) of a first group may be programmed based on the MLC method and the TLC method, but word lines (for example, WL1, WL3, and WL5) of a second group may be programmed based on the QLC method. A characteristic of word lines located in a relatively lower portion in the deterioration area may be lower. Therefore, a first word line WL0 of the word lines of the first group may be programmed based on the SLC method, but a third word line WL3 may be programmed based on the MLC method. Also, fifth and seventh word lines WL4 and WL6, located in an upper portion, of the word lines of the first group may be programmed based on the TLC method.

In FIG. 16C, an example where word lines of a normal area are programmed based on the TLC method and word lines of a deterioration area are programmed based on the MTMT method is illustrated. For example, word lines (for example, WL0, WL2, WL4, and WL6) of a first group in the deterioration area may be programmed based on the MLC method, but word lines (for example, WL1, WL3, and WL5) of a second group may be programmed based on the TLC method.

FIGS. 17A and 17B are tables showing a memory system 400 and an operating method of the memory system, according to a modifiable embodiment. In FIGS. 17A and 17B, an example where at least two (K) word lines WL0 to WL(K-1) is illustrated.

Referring to FIG. 17A, the memory system 400 may include a memory controller 410 and a memory device 420, and the memory device 420 may include a memory cell array 421, a voltage generator 422, and a distribution controller 423. Also, the memory controller 410 may include an address conversion module 411 and a cycle detector 412. The elements illustrated in FIG. 17A are merely one embodiment, and the present embodiment is not limited thereto. For example, a program sequence of word lines in a deterioration area may be controlled in the memory device 420 as in the above-described embodiment. Also, a cycle detection operation may be performed in the memory device 420.

The cycle detector 412 may detect a cycle of a program and/or erase operation in the memory system 400. For example, as the program and/or erase cycle increases, a deterioration characteristic of the memory system 400 may increase, and particularly, a deterioration state of each of word lines where a relatively large number of data bits are programmed may increase.

A driving method of the word lines in the deterioration area may be changed based on a cycle detection result of the program and/or erase operation detected by the cycle detector 412. For example, when the program and/or erase cycle is greater than a certain threshold value (or a reference number Num_Ref), the driving method of the word lines in the deterioration area may be changed.

Referring to FIG. 17B, before the program and/or erase cycle becomes greater than the reference number Num_Ref, word lines WL0 and WL2 of a first group in the deterioration area may be programmed based on the TLC method, and word lines WL1 and WL3 of a second group may be programmed based on the QLC method. At this time, as the number of QLC-based programming on the word lines WL1 and WL3 of the second group increases, a characteristic of the word lines WL1 and WL3 of the second group is more deteriorated than the word lines WL0 and WL2 of the first group.

As the program and/or erase cycle becomes greater than the reference number Num_Ref, a program method may be changed so that word lines WL0, WL2, ... of the first group in the deterioration area are programmed based on the QLC method, and word lines WL1, WL3, ... of the second group are programmed based on the TLC method. Such a method change operation may be controlled by the memory controller 410 or the memory device 420. For example, the memory controller 410 may control a program operation so that the word lines WL1, WL3, ... of the second group are first programmed based on the TLC method, and then, the word lines WL0, WL2, ... of the first group are programmed based on the QLC method. Alternatively, a program operation may be controlled in order for the word lines WL1, WL3, ... of the second group to be first programmed, based on an address conversion operation performed in the memory device 420

Figure 18A:
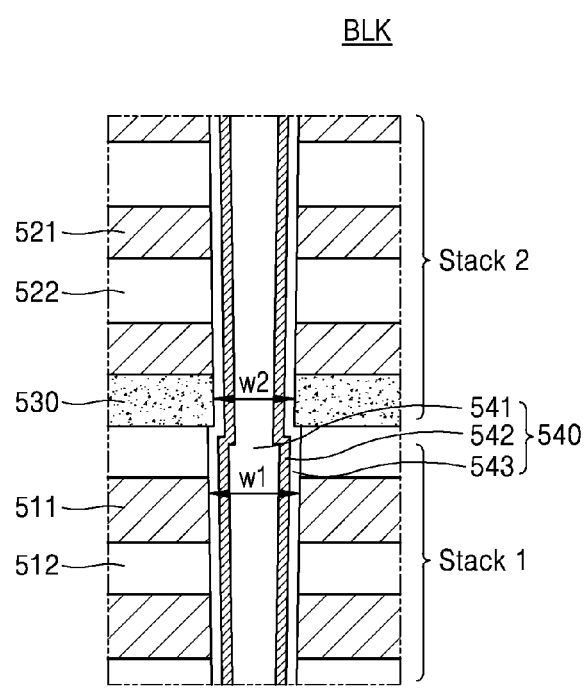
FIGS. 18A and 18B are diagrams illustrating a memory device according to a modifiable example embodiment.
Figure 18B:
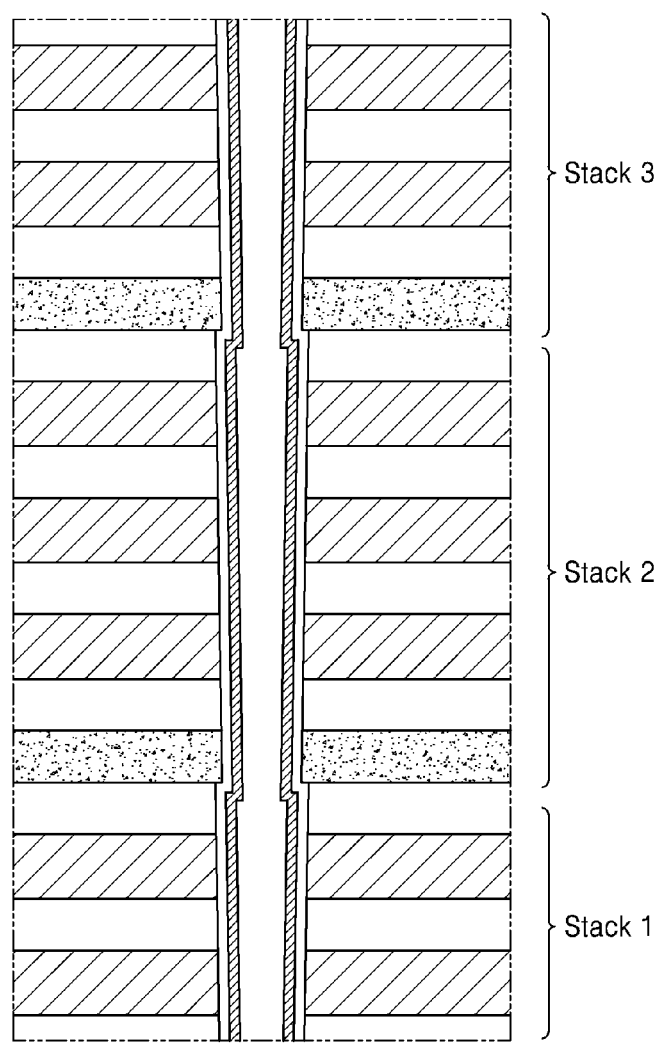

FIGS. 18A and 18B are diagrams illustrating a memory device according to a modifiable example embodiment.

As described above, a characteristic of word lines in a certain area of a memory cell array is reduced due to various causes such as a manufacturing process and driving of a device. For example, an etching process of forming a channel hole for forming a channel structure in a memory block implemented in a 3D structure may be performed, and a diameter of the channel hole may be changed based on a height of a memory block. For example, the diameter of the channel hole may be reduced in a direction from an upper portion to a lower portion of the memory block having the 3D structure.

In order to prevent the diameter of the channel hole from being excessively reduced in the memory block having the 3D structure, the etching process of forming the channel hole may be performed at least twice. FIG. 18A illustrates a portion of a cross-sectional surface of the memory block. Referring to FIG. 18A, the etching process may be performed after a first stack structure (or a first stack) is formed on a semiconductor substrate (not shown), and then, a second stack structure (or a second stack) may be formed on the first stack structure. Also, the etching process may be performed on the second stack structure.

For example, in a memory block BLK having the 3D structure, a first stack Stack1 may include a gate electrode 511 and an insulation film pattern layer 512 which are alternately arranged in a vertical direction. Also, a second stack Stack2 may include a gate electrode 521 and an insulation film pattern layer 522 which are alternately arranged in a vertical direction. According to an embodiment, an inter-structure layer 530 may be disposed between the first stack Stack1 and the second stack Stack2. Also, a channel structure 540 may include a channel 542, a dielectric structure 543 surrounding an outer wall of the channel 542, and a channel burial film pattern 541 disposed inside the channel 542. Such a structure is merely an embodiment, and the memory block BLK having the 3D structure according to embodiments may have other various structures which are formed by performing the etching process at least twice.

In this case, a diameter w1 of a channel hole formed in an upper portion of the first stack Stack1 may be greater than a diameter w2 of a channel hole formed in a lower portion of the second stack Stack2. In this case, one or more word lines disposed in the lower portion of the second stack Stack2 may correspond to a deterioration area. Also, one or more word lines disposed in the upper portion of the first stack Stack1 may have characteristic which is reduced due to a process of forming the second stack Stack2, and thus, may be defined as a deterioration area.

FIG. 18B illustrates an example where an etching process is performed at least three times in implementing a memory block BLK having a 3D structure is illustrated. In addition, an embodiment may be applied to a memory block BLK on which an etching process is performed a larger number of times.

FIGS. 19A, 19B, 19C, and 19D are diagrams illustrating examples which define a deterioration area in a memory device according to a modifiable example embodiment. In FIGS. 19A, 19B, 19C, and 19D, an example where an etching process is performed twice in implementing a memory block BLK having a 3D structure is illustrated. However, as described above, the etching process may be performed various times. Also, in FIGS. 19A, 19B, 19C, and 19D, various implementation examples of the memory block BLK having the 3D structure are illustrated.

Figure 19A:
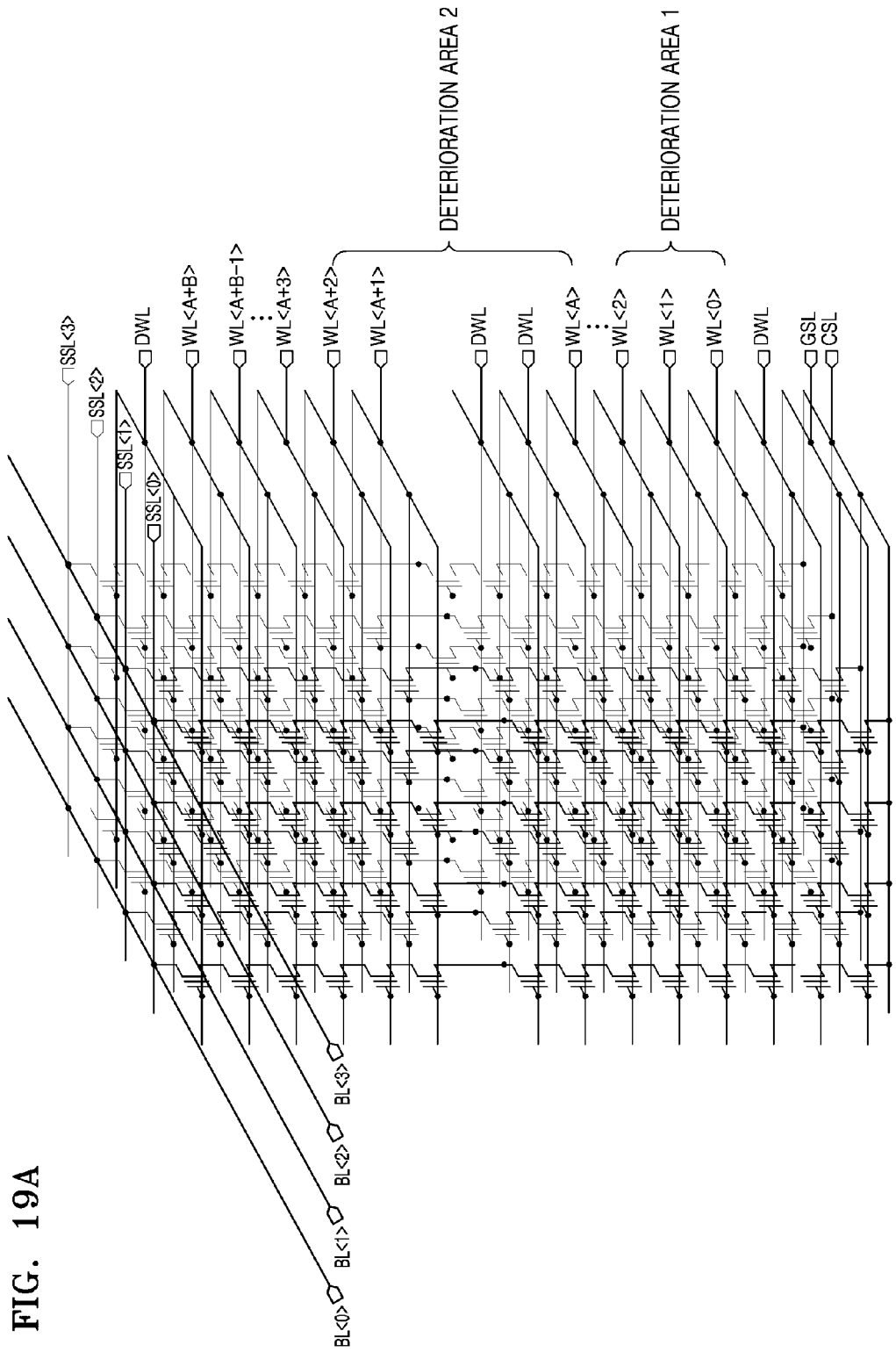
FIGS. 19A, 19B, 19C, and 19D are diagrams illustrating examples which define a deterioration area in a memory device according to a modifiable example embodiment.

Referring to FIG. 19A, a first stack may include multiple word lines WL<0> to WL<A> and one or more dummy word lines DWL. Also, the first stack may further include a common source line CSL and a ground selection line GSL. In FIG. 19A, an example where two dummy word lines DWL are disposed on the word lines WL<0> to WL<A> is illustrated. However, the number of the dummy word lines DWL may be changed.

Moreover, a second stack may be stacked on the first stack and may include multiple word lines WL<A+1> to WL<A+B>, one or more dummy word lines DWL, and multiple string selection lines SSL0 to SSL3. Also, multiple bit lines may be connected to the second stack.

As in the above-described example, in a memory block having a 3D structure, a deterioration area may be defined based on various manners. In FIG. 19A, an example where some of word lines located in a lower portion of the first stack are included in a first deterioration area and one or more word lines located in an upper portion of the first stack and one or more word lines located in a lower portion of the second stack are included in a second deterioration area is illustrated. A program operation may be performed on the word lines included in the first and second deterioration areas according to the above-described embodiments. That is, in programming word lines included in each of deterioration areas, the number of word lines deteriorated in each deterioration area is minimized by controlling a program sequence or a threshold voltage distribution.

Figure 19B:
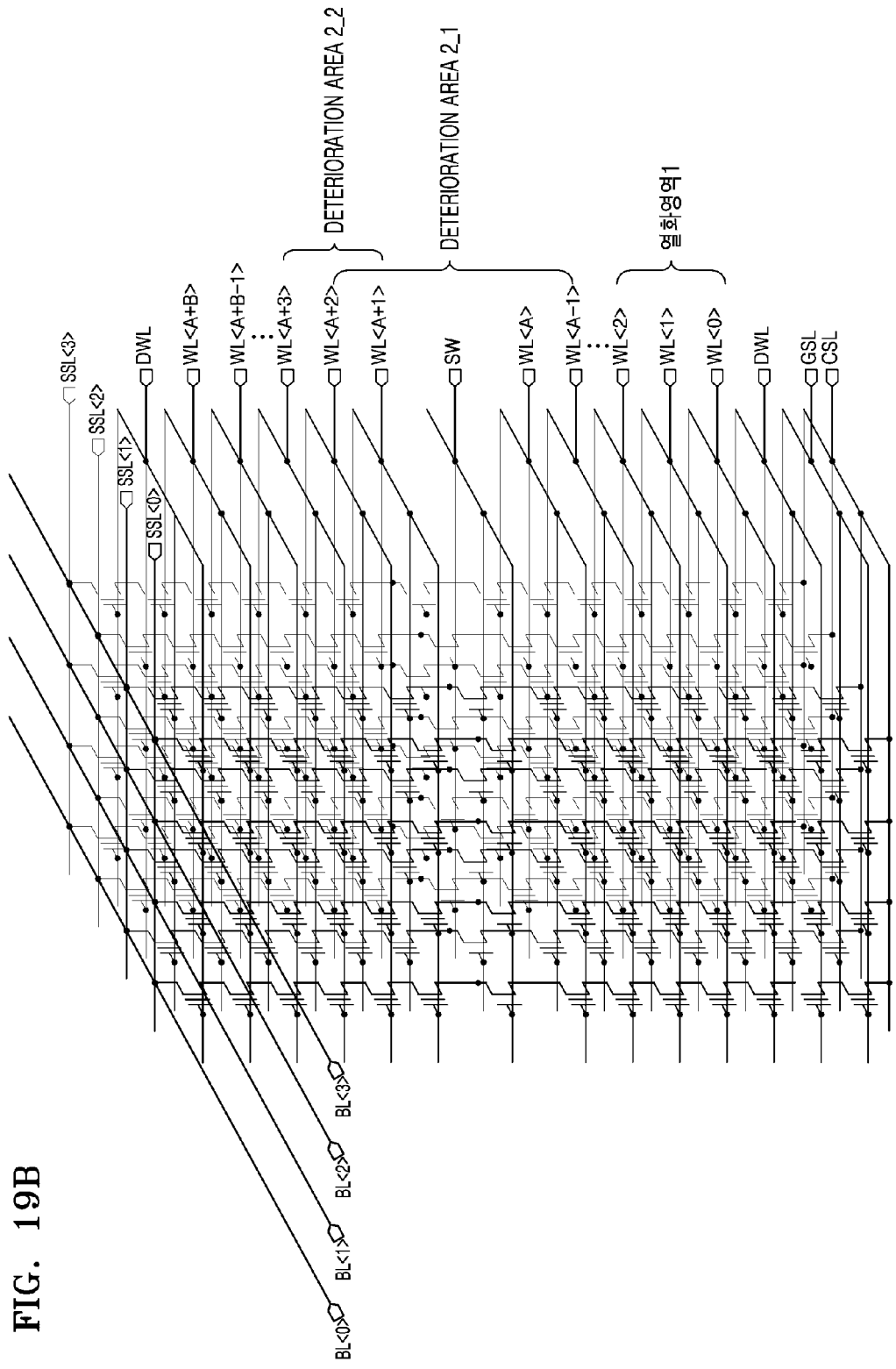

FIG. 19B illustrates a modifiable example of a memory block having a 3D structure, and for example, unlike an example of FIG. 19A, a transistor operating as a switch SW may be disposed on multiple word lines WL<0> to WL<A> of a first stack.

As in the above-described embodiment, some of word lines located in a lower portion of a first stack may be included in a first deterioration area. Also, one or more word lines located in an upper portion of the first stack and one or more word lines located in a lower portion of the second stack may be included in a second deterioration area 2_1. As described above, a program sequence and a threshold voltage distribution in each of deterioration areas may be controlled according to the above-described embodiment.

A switch may be disposed between word lines WL<0> to WL<A> of the first stack and word lines WL<A+1> to WL<A+B> of the second stack. An influence of the second stack on the word lines WL<0> to WL<A> of the first stack is reduced by the switch. Accordingly, in a modifiable embodiment, the one or more word lines located in the lower portion of the second stack may be selectively included in the second deterioration area 2_1.

Figure 19C:
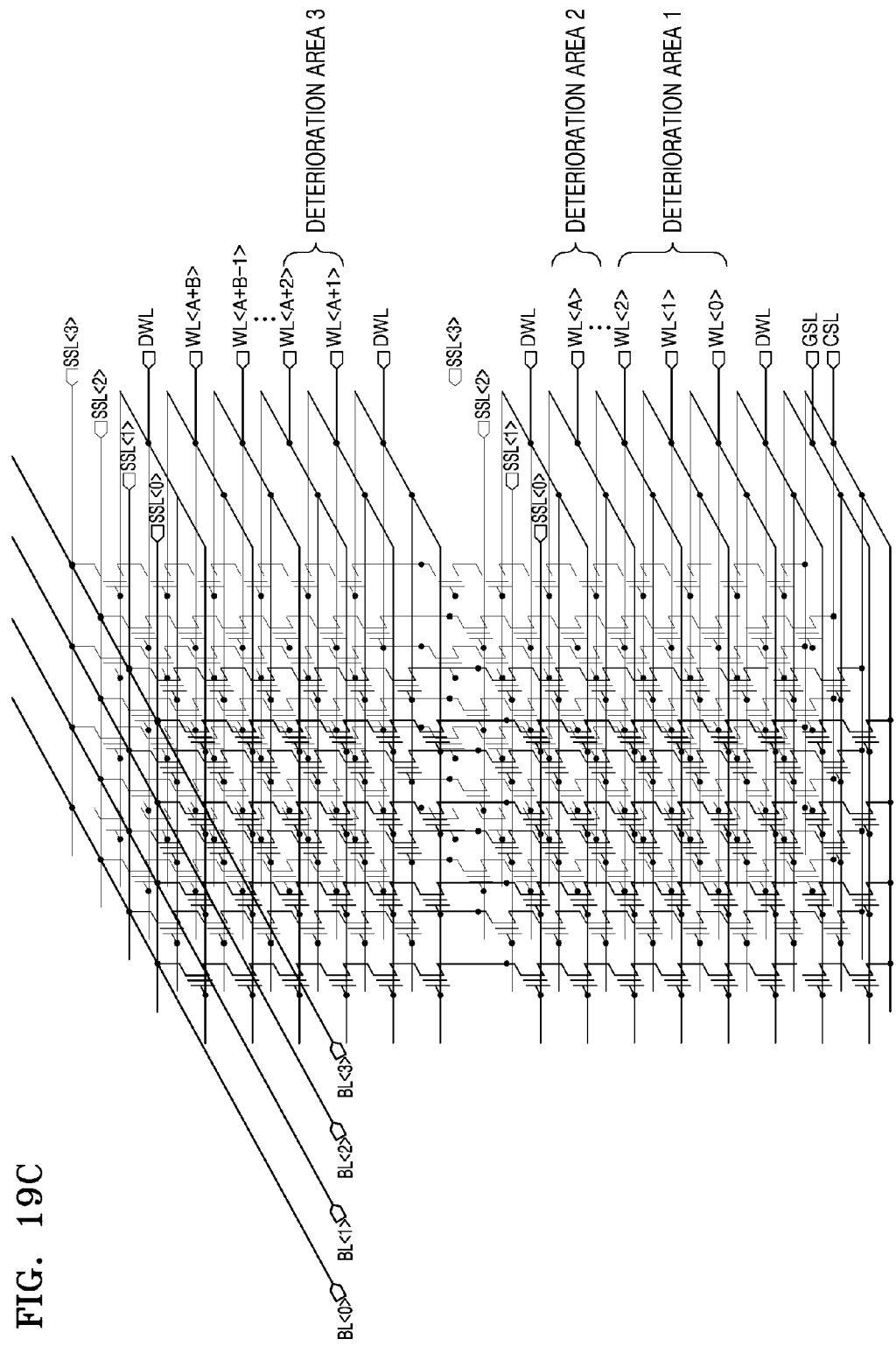

FIG. 19C illustrates an example where string selection lines SSL0 to SSL3 are disposed in correspondence with each of stacks. Referring to FIG. 19, word lines WL<0> to WL<A> of a first stack or memory cells may be selected by string selection lines SSL0 to SSL3 provided in the first stack, and word lines WL<A+1> to WL<A+B> of the second stack or memory cells may be selected by string selection lines SSL0 to SSL3 provided in the second stack.

According to an example embodiment, in a memory block having a 3D structure illustrated in FIG. 19C, a deterioration area may be variously defined. For example, assuming that one or more word lines located in an upper portion of the first stack are deteriorated and one or more word lines located in a lower portion of the second stack are deteriorated, a word line located in the upper portion of the first stack and a word line located in the lower portion of the second stack may each be defined as a separate deterioration area. For example, one or more word lines located in the lower portion of the first stack may be included in a first deterioration area, one or more word lines located in the upper portion of the first stack may be included in a second deterioration area, and one or more word lines located in the lower portion of the second stack may be included in a third deterioration area.

The control of a program sequence and a threshold voltage distribution according to the above-described embodiments may be performed in units of one deterioration area. Therefore, programming on word lines of the first deterioration area and word lines of the second deterioration area may be controlled based on an operation of each of the string selection lines SSL0 to SSL3 provided in the first stack. Programming on word lines of the third deterioration area may be controlled based on an operation of each of the string selection lines SSL0 to SSL3 provided in the second stack.

FIG. 19B illustrates an example where bit lines BL<0> to BL<3> are provided between a first stack and a second stack, and string selection lines SSL0 to SSL3 are disposed in correspondence with each of stacks. For example, a memory block of FIG. 19D may have a structure where the second stack is revered in the memory block of FIG. 19C. Also, FIG. 19 illustrates an example where the first stack includes A+1 number of word lines WL<0> to WL<A>, and the second stack includes B+1 number of word lines WL<0> to WL<B>.

Figure 19D:
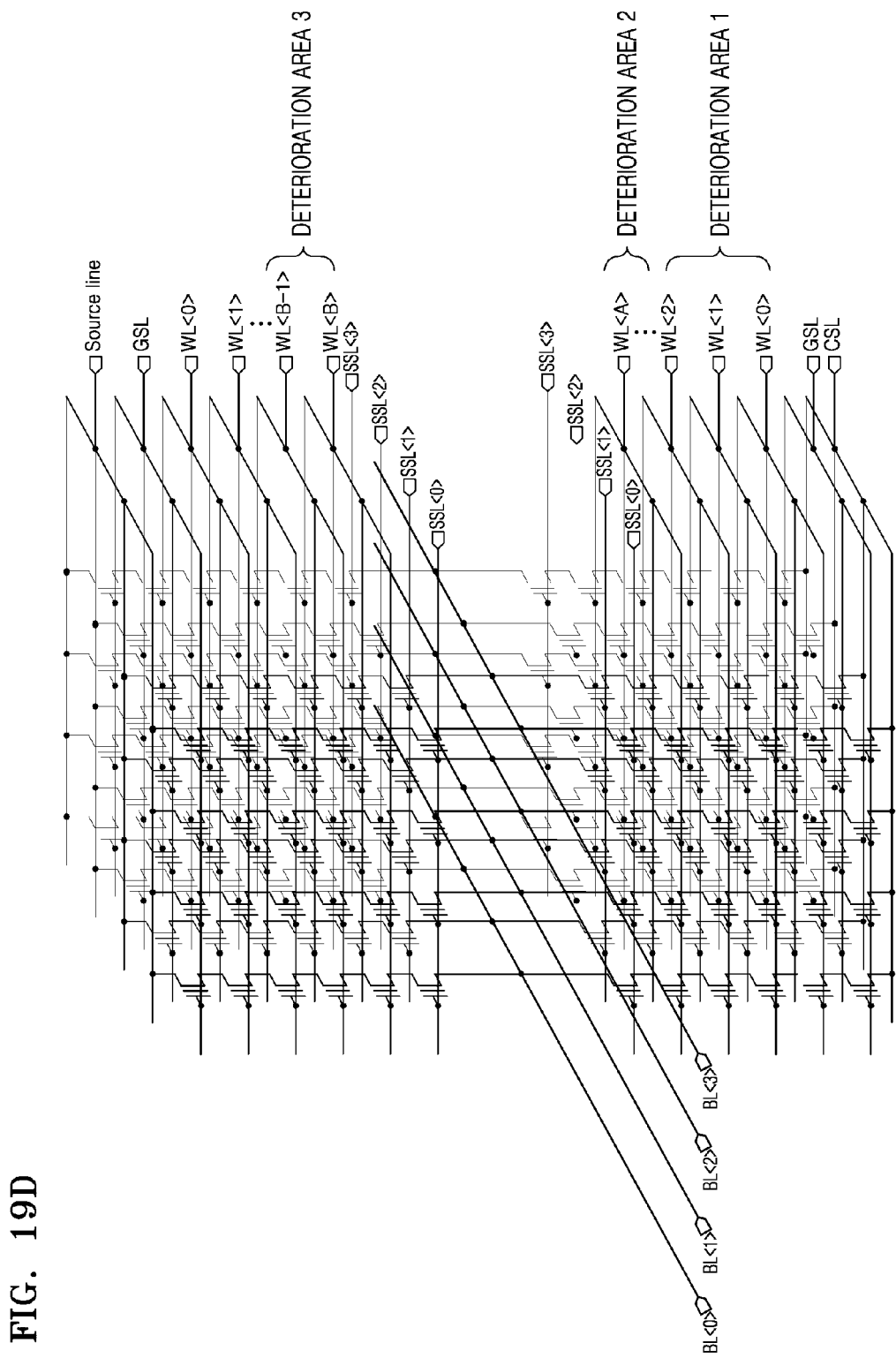

In an example of FIG. 19D, a deterioration area may be variously defined. For example, one or more word lines located in a lower portion of the first stack, one or more word lines located in an upper portion of the first stack, and one or more word lines located in a lower portion of the second stack may be defined as a deterioration area. Moreover, identically or similarly to the embodiment of FIG. 19C, the one or more word lines located in the lower portion of the first stack may be included in a first deterioration area, the one or more word lines located in the upper portion of the first stack may be included in a second deterioration area, and the one or more word lines located in the lower portion of the second stack may be included in a third deterioration area.

FIGS. 19A, 19B, 19C, and 19D illustrate an example where a memory block is assumed as including two stacks, and if the memory block includes a larger number of stacks, a deterioration area according to embodiments may be variously defined. Also, FIGS. 19A, 19B, 19C, and 19D are merely an example, and in each of the memory blocks respectively illustrated in FIGS. 19A, 19B, 19C, and 19D, a deterioration area may be defined based on other various manners.

Figure 20:
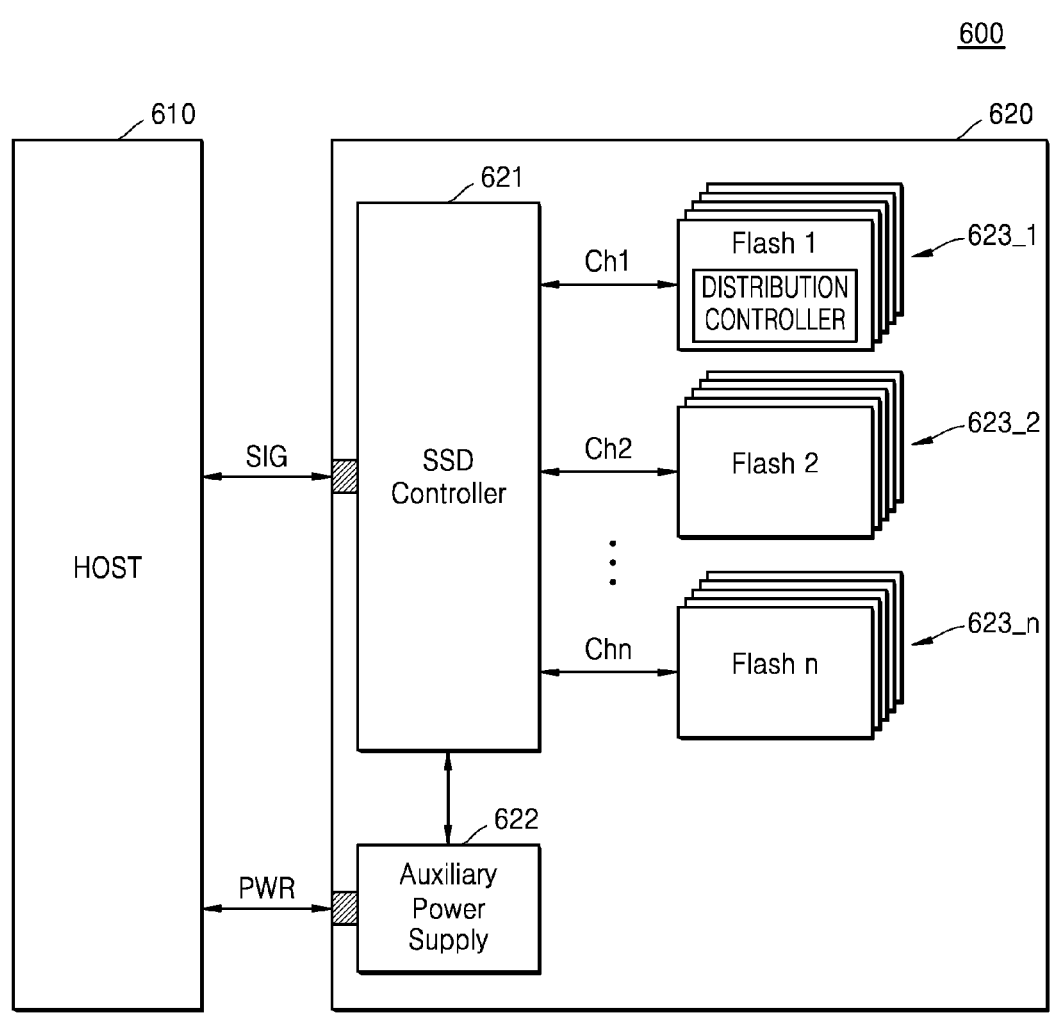
FIG. 20 is a block diagram illustrating an example where a memory device according to embodiments is applied to a solid state drive (SSD) system.

FIG. 20 is a block diagram illustrating an example where a memory device according to embodiments is applied to an SSD system 600.

Referring to FIG. 20, the SSD system 600 may include a host 610 and an SSD 620. The SSD 620 may exchange a signal with the host 610 through a signal connector and may be supplied with power through a power connector. The SSD 620 may include an SSD controller 621, an auxiliary power supply 622, and multiple memory devices 623_1 to 623_n. In this case, the SSD 620 may be implemented by using the embodiments described above with reference to FIGS. 1 to 19A, 19B, 19C, and 19D. Therefore, each of the memory devices 623_1 to 623_n may include multiple word lines, and at least some of the word lines may configure a deterioration area. In word lines of a first group and word lines of a second group in the deterioration area, a program operation and an erase operation may be separately controlled. In FIG. 20, each of the memory devices 623_1 to 623_n may include a distribution controller. Thus, the threshold voltage distribution controller according to the above-described embodiments may be controlled. Also, although not shown in FIG. 20, a program sequence of the word lines in the deterioration area may be controlled through a program control operation of each of the SSD controller 621 or the memory devices 623_1 to 623_n.

In the non-volatile memory device and the program method of the non-volatile memory device according to the embodiments, a characteristic of word lines in a deterioration area of a memory device is enhanced, thereby minimizing an increase in semiconductor chip size and enhancing data reliability.

While the inventive concepts described herein have been particularly shown with reference to embodiments thereof, it will be understood that various changes in form and details may be made therein without departing from the spirit and scope of the following claims.

What is claimed is:

1. A non-volatile memory device, comprising:
a memory cell array comprising a plurality of memory cells connected to a plurality of word lines, some of the plurality of word lines corresponding to a deterioration area; and
a voltage generator configured to generate a program voltage provided to the plurality of memory cells through the plurality of word lines,
wherein control logic implemented by the non-volatile memory device is configured to control a program operation and an erase operation on the plurality of word lines,
wherein the deterioration area comprises word lines of a first group, where data of at least one first bit is written in each of the plurality of memory cells, and word lines of a second group where data of at least two second bits is written in each of the plurality of memory cells, wherein the at least two second bits are more than the at least one first bits, and
wherein the control logic is configured to control a program sequence so that each of the word lines of the second group is programmed after an adjacent word line of the first group is programmed, and control a distribution so that a threshold voltage level corresponding to an erase state of each of the word lines of the first group is higher than a threshold voltage level corresponding to an erase state of each of the word lines of the second group.

2. The non-volatile memory device of claim 1, wherein the control logic is configured to control the program sequence so that the word lines of the second group are programmed after all of the word lines of the first group are programmed.

3. The non-volatile memory device of claim 1, wherein the control logic comprises:
a program sequence controller configured to control a program sequence of the word lines of the deterioration area; and
a distribution controller configured to control a threshold voltage distribution of the word lines of the deterioration area.

4. The non-volatile memory device of claim 1, wherein the control logic is configured to control a threshold voltage distribution of the word lines of the first group so that a threshold voltage window of the word lines of the first group is less than a threshold voltage window of the word lines of the second group.

5. The non-volatile memory device of claim 1, wherein data corresponding to the erase state of each of the word lines of the first group is stored in memory cells connected to the word lines of the first group by performing a program loop,
the data corresponding to the erase state of each of the word lines of the second group is stored in memory cells connected to the word lines of the second group without performing the program loop, and
a width of a threshold voltage distribution corresponding to the erase state of each of the word lines of the first group is narrower than a width of a threshold voltage distribution corresponding to the erase state of each of the word lines of the second group.

6. The non-volatile memory device of claim 1, wherein the other word lines of the plurality of word lines correspond to a normal area, and number of data bits written in each of memory cells connected to the word lines of the normal area is the same as number of data bits written in each of memory cells connected to the word lines of the second group.

7. The non-volatile memory device of claim 1, wherein the word lines of the deterioration area comprise odd word lines and even word lines, the word lines of the first group comprise ones of the odd word lines and the even word lines, and the word lines of the second group comprise the other word lines of the odd word lines and the even word lines.

8. The non-volatile memory device of claim 1, wherein the word lines of the first group are programmed based on a triple level cell method, and the word lines of the second group are programmed based on a quad level cell method.

9. The non-volatile memory device of claim 1, wherein at least one of an erase voltage and a verify voltage used in an erase operation on the word lines of the first group differs from at least one of an erase voltage and a verify voltage used in an erase operation on the word lines of the second group, and
a threshold voltage level after the erase operation on the word lines of the first group is higher than a threshold voltage level after the erase operation on the word lines of the second group.

10. The non-volatile memory device of claim 1, wherein the memory cell array is a three-dimensional memory cell array where the word lines are vertically disposed on a semiconductor substrate, and the deterioration area comprises at least two word lines adjacent to the semiconductor substrate.

11. An operating method of a memory device including a memory cell array which includes a plurality of word lines and includes a normal area including some of the plurality of word lines and a deterioration area including other word lines of the plurality of word lines, the operating method comprising:
programming data of at least one first bit in each of memory cells connected to word lines of a first group of the deterioration area;
after the programming on the word lines of the first group is completed, programming data of at least two second bits in each of memory cells connected to word lines of a second group of the deterioration area, wherein the at least two second bits are more than the at least one first bit; and
performing programming on the word lines of the normal area,
wherein a threshold voltage level corresponding to an erase state of each of the word lines of the first group is higher than a threshold voltage level corresponding to an erase state of each of the word lines of the second group.

12. The operating method of claim 11, wherein a threshold voltage level after an erase operation on the word lines of the first group is higher than a threshold voltage level after an erase operation on the word lines of the second group.

13. The operating method of claim 12, wherein a level of a verify voltage used in an erase operation on the word lines of the first group is higher than a level of a verify voltage used in an erase operation on the word lines of the second group.

14. The operating method of claim 11, wherein, in a program operation on the memory cells connected to the word lines of the first group, data corresponding to the erase state of each of the word lines of the first group is stored by performing a program loop on the memory cells.

15. The operating method of claim 14, wherein a width of a threshold voltage distribution corresponding to the erase state of each of the word lines of the first group is narrower than a width of a threshold voltage distribution corresponding to the erase state of each of the word lines of the second group.

16. The operating method of claim 11, wherein
a threshold voltage level after an erase operation on the word lines of the first group is higher than a threshold voltage level after an erase operation on the word lines of the second group, and
as data corresponding to the erase state of each of the word lines of the first group is stored in the memory cells connected to the word lines of the first group by performing a program loop, a width of a threshold voltage distribution corresponding to the erase state of each of the word lines of the first group is narrower than a width of a threshold voltage distribution corresponding to the erase state of each of the word lines of the second group.

17. The operating method of claim 11, wherein the word lines of the deterioration area comprise odd word lines and even word lines, the word lines of the first group comprise ones of the odd word lines and the even word lines, and the word lines of the second group comprise other word lines of the odd word lines and the even word lines.

18. An operating method of a memory device including a memory cell array which includes a deterioration area including word lines of a first group and word lines of a second group, the operating method comprising:
programming data of at least one first bit in each of memory cells connected to the word lines of the first group;
after the programming on the word lines of the first group is completed, programming data of at least two second bits in each of memory cells connected to the word lines of the second group, wherein the at least two second bits are more than the at least one first bit;
performing an erase operation using a first verify voltage on the word lines of the first group; and
performing an erase operation using a second verify voltage on the word lines of the second group,
wherein a level of the first verify voltage is higher than a level of the second verify voltage, and a threshold voltage level after an erase operation on the word lines of the first group is higher than a threshold voltage level after an erase operation on the word lines of the second group.

19. The operating method of claim 18, wherein the word lines of the deterioration area comprise odd word lines and even word lines, the word lines of the first group comprise ones of the odd word lines and the even word lines, and the word lines of the second group comprise other word lines of the odd word lines and the even word lines.

20. The operating method of claim 18, further comprising:
storing data corresponding to an erase state of the word lines of the first group in the memory cells connected to the word lines of the first group by performing a program loop; and
storing the data corresponding to an erase state of the word lines of the second group in the memory cells connected to the word lines of the second group without performing the program loop.

* * * * *